(12) United States Patent
Fricker

(10) Patent No.: US 10,971,401 B2
(45) Date of Patent: Apr. 6, 2021

(54) SYSTEMS AND METHODS FOR PRECISION FABRICATION OF AN ORIFICE WITHIN AN INTEGRATED CIRCUIT

(71) Applicant: Cerebras Systems Inc., Los Altos, CA (US)

(72) Inventor: Jean-Philippe Fricker, Los Altos, CA (US)

(73) Assignee: Cerebras Systems Inc., Los Altos, CA (US)

(*) Notice: Subject to any disclaimer, the term of this patent is extended or adjusted under 35 U.S.C. 154(b) by 0 days.

(21) Appl. No.: 16/593,831

(22) Filed: Oct. 4, 2019

(65) Prior Publication Data

US 2020/0118826 A1  Apr. 16, 2020

Related U.S. Application Data

(60) Provisional application No. 62/746,432, filed on Oct. 16, 2018.

(51) Int. Cl.
*H01L 21/78* (2006.01)
*H01L 21/304* (2006.01)
(Continued)

(52) U.S. Cl.
CPC ........ *H01L 21/78* (2013.01); *H01L 21/02019* (2013.01); *H01L 21/0475* (2013.01); *H01L 21/3043* (2013.01); *H01L 21/30604* (2013.01); *H01L 21/76802* (2013.01); *B23K 26/384* (2015.10); *H01L 21/3065* (2013.01); *H01L 21/3105* (2013.01)

(58) Field of Classification Search
CPC .......... H01L 21/30604; H01L 21/0475; H01L 21/76802; H01L 21/02019; H01L 21/3065; H01L 21/3105; H01L 21/3043; H01L 21/78; H01L 23/5384; H01L 23/522; H01L 23/528; H01L 24/00; B23K 26/384
See application file for complete search history.

(56) References Cited

U.S. PATENT DOCUMENTS 4,100,566 A * 7/1978 Okikawa ............. H01L 23/3107
257/675
4,949,035 A    8/1990 Palmer
(Continued)

FOREIGN PATENT DOCUMENTS

CN    106952973 A * 7/2017 ..... H01L 31/022426

OTHER PUBLICATIONS

Lee, Sang Hwui, et al., "Wafer-to-Wafer Alignment for Three-Dimensional Integration: A Review", Journal of Microelectromechanical Systems, vol. 20, No. 4, Aug. 2011.
(Continued)

*Primary Examiner* — Anita K Alanko
(74) *Attorney, Agent, or Firm* — Jeffrey Schox

(57) ABSTRACT

A method for fabricating an orifice in a semiconductor which can include: removing a first depth of the semiconductor using a first material removal technique and removing a second depth of the semiconductor using a second material removal technique. The method can optionally include: adding a sacrificial layer of material and reducing a depth of the semiconductor by a friction-based material removal technique. In examples, the method fabricates a wafer-scale processor with a set of fastening features.

14 Claims, 28 Drawing Sheets

(51) Int. Cl.
  *H01L 21/306* (2006.01)
  *H01L 21/02* (2006.01)
  *H01L 21/04* (2006.01)
  *H01L 21/768* (2006.01)
  *B23K 26/384* (2014.01)
  *H01L 21/3065* (2006.01)
  *H01L 21/3105* (2006.01)

(56) References Cited

U.S. PATENT DOCUMENTS

| | | | |
|---|---|---|---|
| 5,308,682 A | 5/1994 | Morikawa | |
| 5,378,928 A * | 1/1995 | Anderson | H01L 23/3121 257/706 |
| 5,430,611 A | 7/1995 | Patel et al. | |
| 5,770,336 A * | 6/1998 | Choi | C25F 3/14 430/5 |
| 5,898,227 A | 4/1999 | Geffken et al. | |
| 6,211,935 B1 | 4/2001 | Yamada | |
| 6,641,745 B2 * | 11/2003 | Tan | B41J 2/14145 216/27 |
| 6,925,411 B1 | 8/2005 | Drost et al. | |
| 7,141,450 B2 | 11/2006 | Pardo | |
| 7,564,554 B2 | 7/2009 | Weiss | |
| 7,598,167 B2 * | 10/2009 | Watkins | H01L 21/76898 257/E21.597 |
| 7,803,714 B2 * | 9/2010 | Ramiah | H01L 21/3065 257/E21.218 |
| 8,962,474 B2 * | 2/2015 | Yu | H01L 21/76898 257/774 |
| 9,337,124 B1 * | 5/2016 | Herrault | H01L 23/3736 |
| 10,242,891 B2 * | 3/2019 | Fricker | H01L 21/67121 |
| 10,366,967 B2 * | 7/2019 | Fricker | H01L 24/85 |
| 10,468,369 B2 * | 11/2019 | Fricker | H01L 24/32 |
| 2003/0189705 A1 | 10/2003 | Pardo | |
| 2004/0043614 A1 | 3/2004 | Koizumi | |
| 2005/0202651 A1 * | 9/2005 | Akram | B28D 1/221 438/463 |
| 2006/0292866 A1 * | 12/2006 | Borwick | H01L 21/76898 438/667 |
| 2008/0164053 A1 * | 7/2008 | Matsubara | H01L 23/49822 174/255 |
| 2009/0250823 A1 * | 10/2009 | Racz | H01L 21/6835 257/778 |
| 2010/0025828 A1 * | 2/2010 | Sakai | H01L 23/4006 257/666 |
| 2011/0108313 A1 * | 5/2011 | Kung | H05K 3/062 174/261 |
| 2013/0344683 A1 | 12/2013 | Lazerand et al. | |
| 2014/0017880 A1 | 1/2014 | Lei et al. | |
| 2015/0079760 A1 * | 3/2015 | Lei | H01L 21/82 438/462 |
| 2016/0240420 A1 | 8/2016 | Wagenleitner | |
| 2017/0032981 A1 | 2/2017 | Chinnusamy | |
| 2017/0196075 A1 * | 7/2017 | Barron | H01L 23/40 |
| 2018/0033924 A1 | 2/2018 | Andrews et al. | |
| 2018/0166328 A1 | 6/2018 | Tang et al. | |
| 2019/0246491 A1 * | 8/2019 | Zinn | H05K 1/09 |
| 2020/0043831 A1 * | 2/2020 | Cheah | H01L 25/50 |
| 2021/0036179 A1 | 2/2021 | Sung et al. | |

OTHER PUBLICATIONS

West, Perry, "Anatomy of an Application: Automatic Alignment in the Semiconductor Industry", Imagination Corporation and Automated Vision Systems, Inc. 2000, http://www.imagenation.com/pdf/align.pdf.

"Using Vernier Scales", University of California-Berkeley, Electrical Engineering and Computer Science Department, Nov. 1997.

\* cited by examiner

200

```
┌─────────────────────────────────────────────┐
│   Providing a Semiconductor Substrate S210  │
└─────────────────────────────────────────────┘

┌─────────────────────────────────────────────┐
│       Identifying a Largest Square S215     │
└─────────────────────────────────────────────┘

┌─────────────────────────────────────────────┐
│       Fabricating Circuitry Layers S220     │
└─────────────────────────────────────────────┘

┌─────────────────────────────────────────────┐
│    Providing Self-Correcting Mechanisms S222│
└─────────────────────────────────────────────┘

┌─────────────────────────────────────────────┐
│       Providing a Protective Barrier S225   │
└─────────────────────────────────────────────┘

┌─────────────────────────────────────────────┐
│    Fabricating Inter-Die Connections S230   │
└─────────────────────────────────────────────┘

┌─────────────────────────────────────────────┐
│    Semiconductor Substrate Reduction S240   │
└─────────────────────────────────────────────┘
```

FIGURE 2

Initial Contact

Partially Seated

Fully Seated

1100

Providing IC Components With Orifices S1105

Arranging the IC Assembly Components S1110

Providing Securing Elements S1120

Implementing a Pressing Process S1130

Fastening the Securing Elements S1140

Terminating the Press S1150

1200

Providing a Sacrificial Material Layer S1210

Removing a First Depth of Material S1220

Removing the Sacrificial Material Layer S1225

Removing a Second Depth of Material S1230

Reducing a Depth of a Semiconductor S1235

Providing a Sacrificial Material Layer S1210

Setting a Singulation Frame S1240

Removing a First Depth of Material S1250

Removing a Second Depth of Material S1260

Reducing a Depth of a Semiconductor S1270

FIGURE 12A

SYSTEMS AND METHODS FOR PRECISION FABRICATION OF AN ORIFICE WITHIN AN INTEGRATED CIRCUIT

CROSS-REFERENCE TO RELATED APPLICATIONS

This application claims the benefit of U.S. Provisional Application No. 62/746,432, filed 16 Oct. 2018, which is incorporated in its entirety by this reference.

TECHNICAL FIELD

The inventions described herein relate generally to the integrated circuit architecture and fabrication fields, and more specifically to a new and useful integrated circuit architecture and integrated circuit manufacturing methods in the integrated circuit architecture field.

BACKGROUND

While the concept of artificial intelligence has been explored for some time, the modern applications of artificial intelligence have exploded such that artificial intelligence is being integrated into many devices and decision-making models to improve their learning, reasoning, data processing capabilities, and the like of the devices. The most apparent and broad applications of artificial intelligence include machine learning, natural language processing, computer vision, robotics, knowledge reasoning, planning, and general artificial intelligence.

To be effective, many of the above-noted broad applications of artificial intelligence require the consumption of extremely large data sets in the initial training of the artificial intelligence algorithms (e.g., deep learning algorithms, recurrent neural networks algorithms, etc.) being implemented in the specific applications and/or devices (e.g., autonomous vehicles, medical diagnostics, etc.). Because the data sets used in training are often very large and the underlying computer architecture may not be specifically designed for artificial intelligence training, the training of an artificial intelligence algorithm may require thousands of hours of data processing by the underlying computer architecture. While it may be possible to scale or increase the number of computers or servers used in ingesting data sets for training an artificial intelligence algorithm, this course of action often proves to not be economically feasible.

Similar data processing issues arise in the implementation or execution of the artificial intelligence algorithms due to the large amount of data being captured such as data originating from billions of Internet transactions, remote sensors for computer vision, and the like. The modern remote distributed networked servers (e.g., the cloud) and onboard computer processors (e.g., GPUs, CPUs, etc.) appear to be inadequate for ingesting and processing such great volumes of data efficiently to maintain pace with the various implementations of the artificial intelligence algorithms.

Accordingly, there is a need in the semiconductor space and specifically in the computer chip architecture field for an advanced computing processor, computing server, or the like that is capable of rapidly and efficiently ingesting large volumes of data for at least the purposes of allowing enhanced artificial intelligence algorithms and machine learning models to be implemented. Additionally, these advanced computing systems may function to enable improved data processing techniques and related or similar complex and processor-intensive computing to be achieved.

The inventors of the inventions described in the present application have designed an integrated circuit architecture that allows for enhanced data processing capabilities and have further discovered related methods and architectures for fabricating the integrated circuit(s), packaging the integrated circuit(s), powering/cooling the integrated circuit(s), and the like.

The below-described embodiments of the present application provide such advanced and improved computer chip architecture and related IC fabrication techniques.

SUMMARY OF THE INVENTION(S)

In one embodiment, a method for fabricating an orifice in a multi-layered semiconductor substrate includes adding a sacrificial layer of material to a first surface of a semiconductor substrate; subsequently, removing a first radius of a first depth of material from the semiconductor substrate along a direction normal to the first surface, the removal of the first depth of material uses a first removal technique that removes the first depth of material; and removing a second radius of a second depth of material from the semiconductor substrate along the direction normal to the first surface based on the removal of the first depth of material, the removal of the second depth of material uses a second removal technique.

In one embodiment, the first radius for removing the first depth of material and the second radius for removing the second depth of material share a common point of origin, and the second radius having a second radial distance that is smaller than a first radial distance of first radius.

In one embodiment, removing the first depth of material from the semiconductor substrate includes removing at least a radial section of the sacrificial layer of material and a radial section of a metal layer of the semiconductor substrate.

In one embodiment, the radial section of the metal layer comprises an active circuitry layer of the semiconductor substrate, removing the first depth of material of the semiconductor substrate further includes removing a radial section of dielectric material from the semiconductor substrate.

In one embodiment, the second removal technique for removing the second depth of material from the semiconductor substrate is distinct from the first removal technique for removing the first depth of material from the semiconductor material.

In one embodiment, the first removal technique for removing the first depth of material from the semiconductor substrate includes a laser ablation of the first depth of material.

In one embodiment, the second removal technique for removing the second depth of material from the semiconductor substrate includes a chemical etching of the second depth of material, the second depth of material includes a silicon-based material.

In one embodiment, the first depth of material includes a full depth of a metal layer of the semiconductor substrate and a partial depth of a silicon layer of material that includes dielectric material.

In one embodiment, removing the first depth of material includes: removing the first depth of material of the semiconductor substrate that includes an active circuitry layer of material until a silicon layer of material of the semiconductor substrate that is arranged beyond the first depth of material is exposed.

In one embodiment, the method includes removing the sacrificial layer of material along an entirety of the first surface of the semiconductor substrate based on (i) the removal of the first depth of material and (ii) the removal of the second depth of material from the semiconductor substrate.

In one embodiment, the method includes in advance of the removal of the first depth of material and the removal of the second depth of material from the semiconductor substrate, reducing a depth of the semiconductor substrate along a second surface of the semiconductor substrate that is opposite the first surface of the semiconductor substrate thereby reducing the second depth of material.

In one embodiment, the method includes in advance of the removal of the second depth of material, removing a plurality of trenches of material along a second surface of the semiconductor substrate that is opposite the first surface of the semiconductor substrate thereby reducing the second depth of material.

In one embodiment, the first depth of material of the semiconductor substrate comprises a first composition of material that is distinct from a second composition of material of the second depth of material of the semiconductor substrate.

In one embodiment, adding the sacrificial layer to the first surface of the semiconductor substrate includes: depositing a coating of sacrificial material onto an active circuitry layer of the semiconductor substrate.

In one embodiment, the first depth of material of the semiconductor substrate includes at least an active circuitry layer, the second depth of material of the semiconductor substrate includes a silicon layer, and the second depth of material of the semiconductor substrate is greater than the first depth of material of the semiconductor substrate.

In one embodiment, a method for fabricating an orifice in a semiconductor wafer includes removing a first radius of a first depth of material from an semiconductor wafer along a direction normal to the first surface, the removal of the first depth of material uses a first removal technique that removes the first depth of material; and removing a second radius of a second depth of material from the semiconductor wafer along the direction normal to the first surface based on the removal of the first depth of material, the removal of the second depth of material uses a second removal technique, wherein the first depth of material of the semiconductor substrate and the second depth of the semiconductor substrate define a full depth of the semiconductor substrate.

In one embodiment, the first radius for removing the first depth of material and the second radius for removing the second depth of material share a common point of origin, and the second radius has a second radial distance that is smaller than a first radial distance of first radius.

In one embodiment, the second removal technique for removing the second depth of material from the semiconductor substrate is distinct from the first removal technique for removing the first depth of material from the semiconductor material.

In one embodiment, a method for fabricating an orifice in an integrated circuit wafer includes: removing a first radius of a first depth of material from an integrated circuit wafer along a direction normal to the first surface, the removal of the first depth of material uses a first removal technique that removes the first depth of material; and removing a second radius of a second depth of material from the integrated circuit wafer along the direction normal to the first surface based on the removal of the first depth of material, the removal of the second depth of material uses a second removal technique, wherein the first depth of material of the integrated circuit substrate and the second depth of the integrated circuit substrate define a full depth of the semiconductor substrate.

In one embodiment, the first radius for removing the first depth of material and the second radius for removing the second depth of material share a common point of origin, the second radius has a second radial distance that is smaller than a first radial distance of first radius, and the second removal technique for removing the second depth of material from the semiconductor substrate is distinct from the first removal technique for removing the first depth of material from the semiconductor material.

In one embodiment, a method for fabricating an orifice in an integrated circuit wafer includes: removing a first radius of a first depth of material from an integrated circuit wafer along a direction normal to the first surface, the removal of the first depth of material uses a first removal technique that removes the first depth of material; and removing a second radius of a second depth of material from the integrated circuit wafer along the direction normal to the first surface based on the removal of the first depth of material, the removal of the second depth of material uses a second removal technique, wherein the first depth of material of the integrated circuit substrate and the second depth of the integrated circuit substrate define a full depth of the semiconductor substrate.

In one embodiment, the first radius for removing the first depth of material and the second radius for removing the second depth of material share a common point of origin, the second radius has a second radial distance that is smaller than a first radial distance of first radius, and the second removal technique for removing the second depth of material from the semiconductor substrate is distinct from the first removal technique for removing the first depth of material from the semiconductor material.

In one embodiment, a method for singulation of a multi-layered semiconductor substrate includes providing a sacrificial layer of material to a first surface of a semiconductor substrate; setting a singulation frame opposing the first surface of the semiconductor substrate; subsequently, removing a first depth of material from the semiconductor substrate along a direction normal to the first surface based on the setting of the singulation frame, the removal of the first depth of material uses a first removal technique that removes the first depth of material; removing a second depth of material from the semiconductor substrate along the direction normal to the first surface based on the removal of the first depth of material, the removal of the second depth of material uses a second removal technique; and severing a first portion of the semiconductor substrate from a second portion of the semiconductor substrate based on (i) the removal of the first depth of material and (ii) the removal of the second depth of material.

In one embodiment, the severing includes reducing a partial depth of material along a second surface of the second semiconductor substrate until a cavity formed within the removal of the second depth of material is exposed.

In one embodiment, the partial depth of material relates to a total depth of the semiconductor substrate less a sum of the first depth of material and the second depth of material.

In one embodiment, the severing implements a third material removal technique distinct from the first material removal technique and the second material removal technique, the material removal technique includes a friction-based material removal technique applied the second surface of the semiconductor substrate.

In one embodiment, the severing includes by exposing from a second surface of the semiconductor substrate a spacing formed by the removal of the first depth of material and the removal of the second depth of material.

In one embodiment, the removal of the first depth of material is performed along at least a first linear length of the semiconductor substrate, the removal of the second depth of material is performed along at least a second linear length of the semiconductor substrate, the first linear length and the second linear length share a common central linear axis, and the severing is performed along the common central linear axis.

In one embodiment, the removal of the first depth of material is performed along a first circumferential length of the semiconductor substrate, the removal of the second depth of material is performed along a second circumferential length of the semiconductor substrate, the first circumferential length and the second circumferential length share a common center point, and the severing is performed along the first and the second circumferential lengths.

In one embodiment, Setting the singulation frame includes aligning slots of the singulation frame beyond scribe lines along the first surface of the semiconductor wafer, wherein the alignment of the slots set a position for performing the first removal of the first depth of material and the second removal of the second depth of material.

In one embodiment, setting of the singulation frame includes aligning slots of the singulation frame over an active circuitry layer of one or more die of the semiconductor substrate, wherein the alignment of the slots set a position for performing the first removal of the first depth of material and the second removal of the second depth of material.

In one embodiment, removing the first depth of material from the semiconductor substrate includes removing the sacrificial layer of material and removing a metal layer of the semiconductor substrate.

In one embodiment, the metal layer comprises an active circuitry layer of the semiconductor substrate, and removing the first depth of material of the semiconductor substrate further includes removing a layer of dielectric material from the semiconductor substrate.

In one embodiment, the second removal technique for removing the second depth of material from the semiconductor substrate is distinct from the first removal technique for removing the first depth of material from the semiconductor substrate.

In one embodiment, the first removal technique for removing the first depth of material from the semiconductor substrate includes a laser ablation of the first depth of material.

In one embodiment, the second removal technique for removing the second depth of material from the semiconductor substrate includes a chemical etching of the second depth of material, and the second depth of material includes a silicon-based material.

In one embodiment, the first depth of material includes a full depth of a metal layer of the semiconductor substrate and a partial depth of a silicon layer of material of the semiconductor substrate that includes dielectric material.

In one embodiment, removing the first depth of material includes: removing the first depth of material of the semiconductor substrate that includes an active circuitry layer of material until a silicon layer of material of the semiconductor substrate that is arranged beyond the first depth of material is exposed.

In one embodiment, removing the sacrificial layer of material along an entirety of the first surface of the semiconductor substrate based on (i) the removal of the first depth of material and (ii) the removal of the second depth of material from the semiconductor substrate.

In one embodiment, the method includes after (i) the removal of the first depth of material and (ii) the removal of the second depth of material from the semiconductor substrate, reducing a depth of the semiconductor substrate along a second surface of the semiconductor substrate that is opposite the first surface of the semiconductor substrate thereby reducing the second depth of material and exposing a cavity formed by the first removal of the first depth of material and the removal of the second depth of material.

In one embodiment, the first depth of material of the semiconductor substrate includes at least an active circuitry layer, the second depth of material of the semiconductor substrate includes a silicon layer, and the second depth of material of the semiconductor substrate is greater than the first depth of material of the semiconductor substrate.

In one embodiment, a method for singulation of a multi-layered integrated circuit wafer includes: setting a singulation frame opposing the first surface of the integrated circuit wafer; subsequently, removing a first depth of material from the integrated circuit wafer along a direction normal to the first surface based on an alignment of the singulation frame, the removal of the first depth of material uses a first removal technique that removes the first depth of material; removing a second depth of material from the integrated circuit wafer along the direction normal to the first surface based on the removal of the first depth of material, the removal of the second depth of material uses a second removal technique distinct from the first removal technique; and severing a first portion of the semiconductor substrate from a second portion of the semiconductor substrate based on (i) the removal of the first depth of material and (ii) the removal of the second depth of material.

BRIEF DESCRIPTION OF THE FIGURES

FIG. 2 illustrates a method 200 in accordance with one or more embodiments of the present application;

FIGS. 12-12A illustrate a method 1200 and a variant thereof in accordance with one or more embodiments of the present application;

DESCRIPTION OF THE PREFERRED EMBODIMENTS

Figure 1:
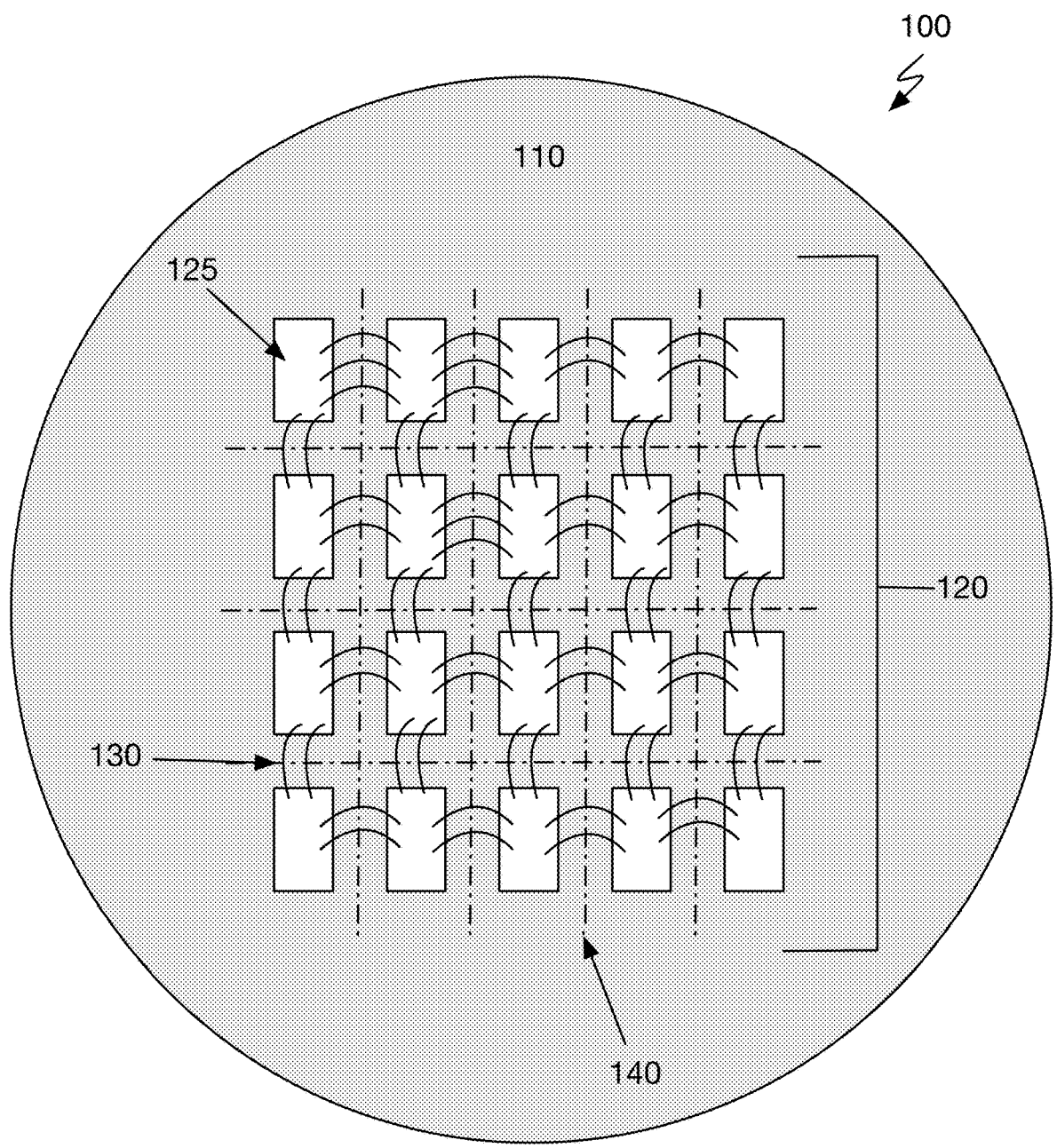
FIG. 1 illustrates a schematic of a system 100 in accordance with one or more embodiments of the present application.
Figure 3A:
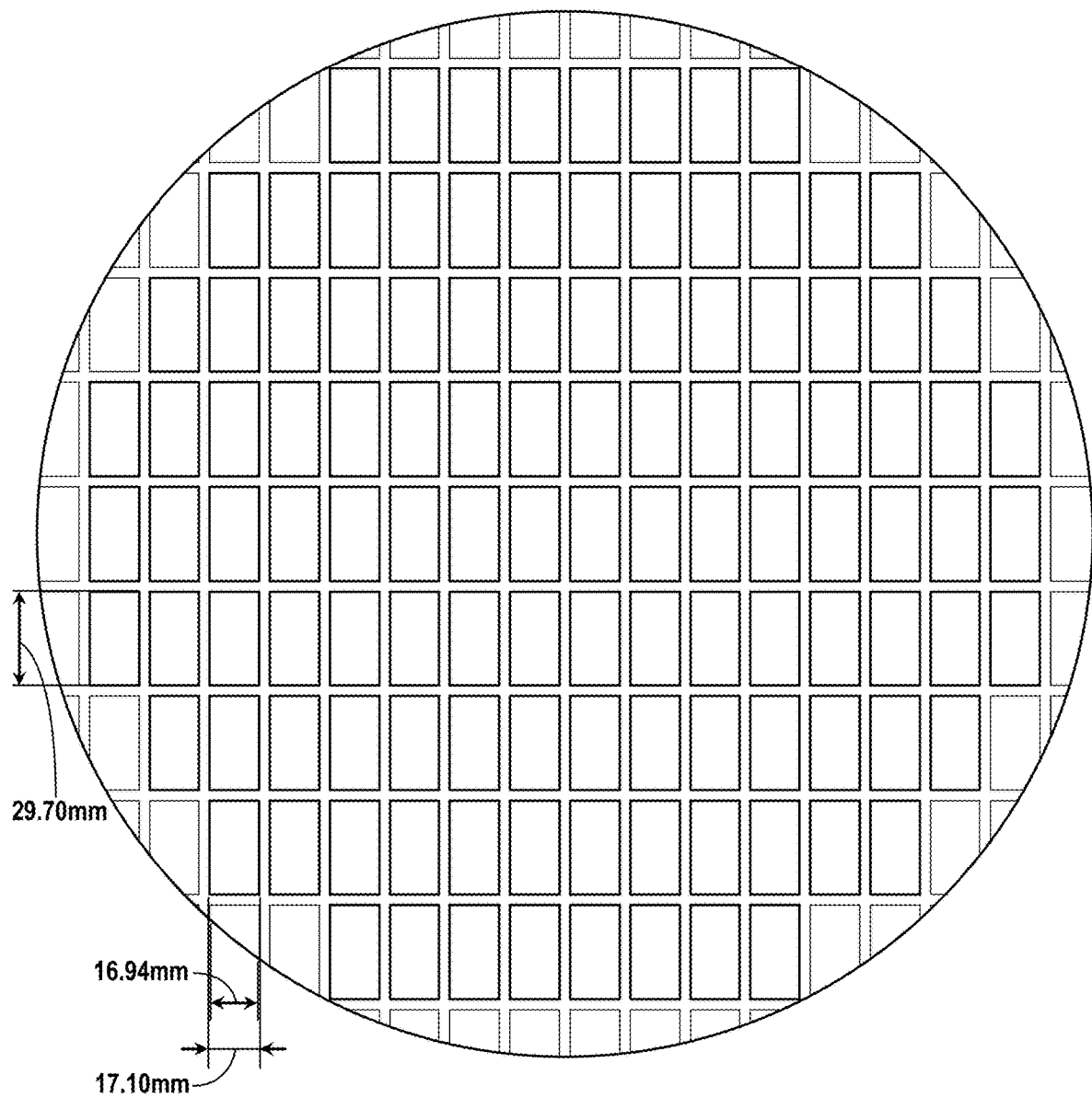
FIG. 3A-3D illustrate several schematics of a semiconductor substrate without and with interconnections in accordance with one or more embodiments of the present application.
Figure 3B:
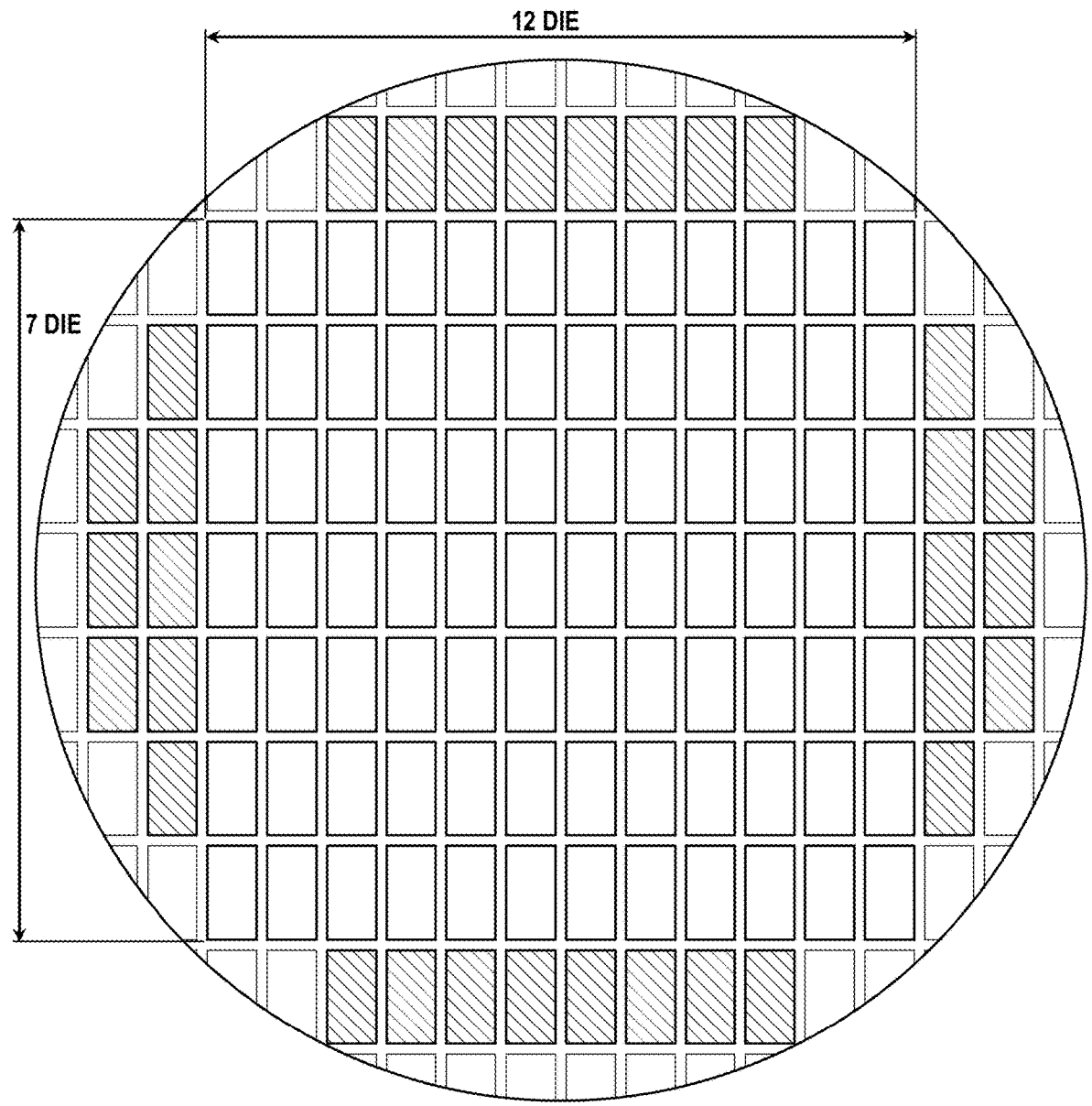
Figure 3C:
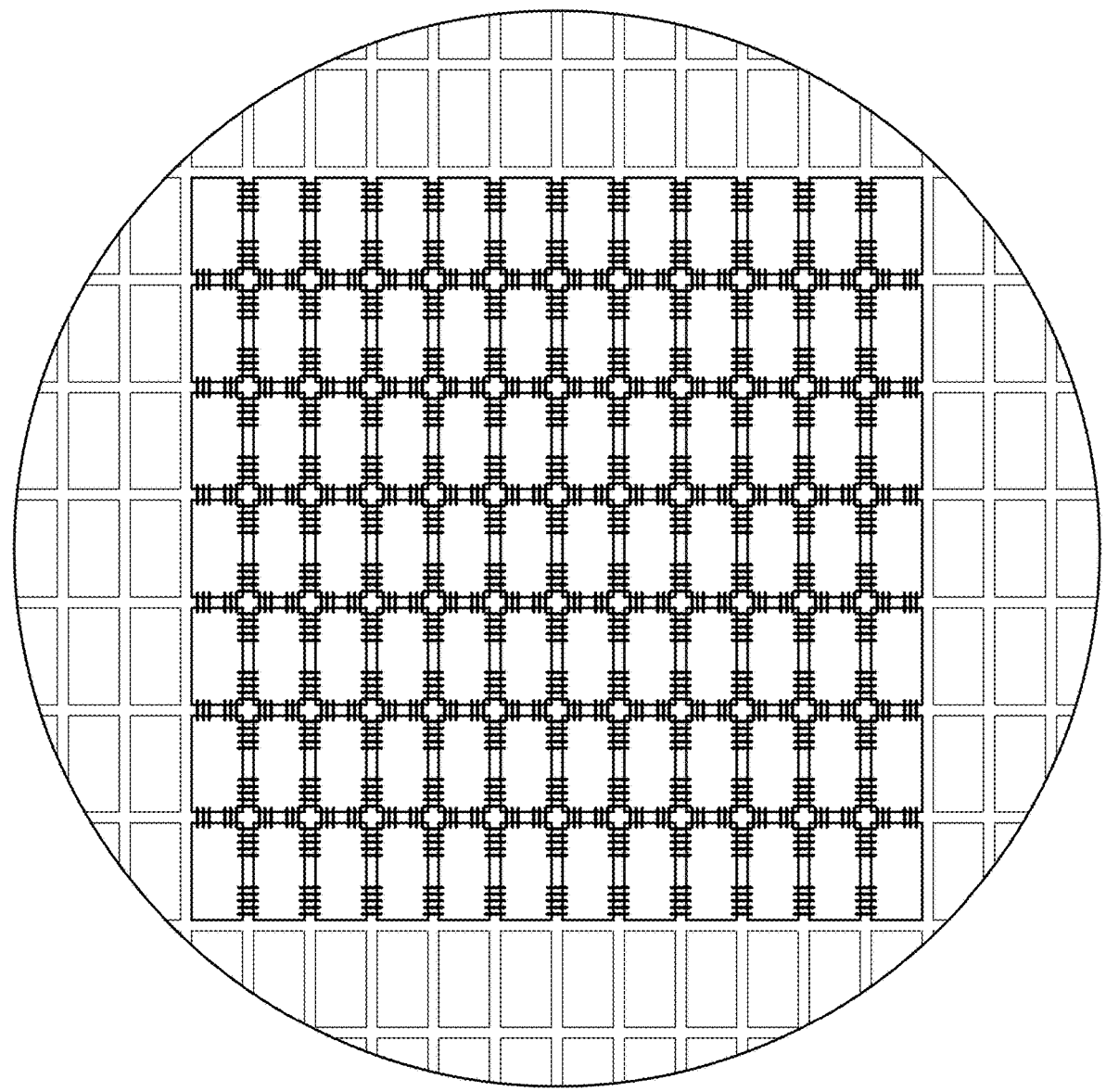
Figure 3D:
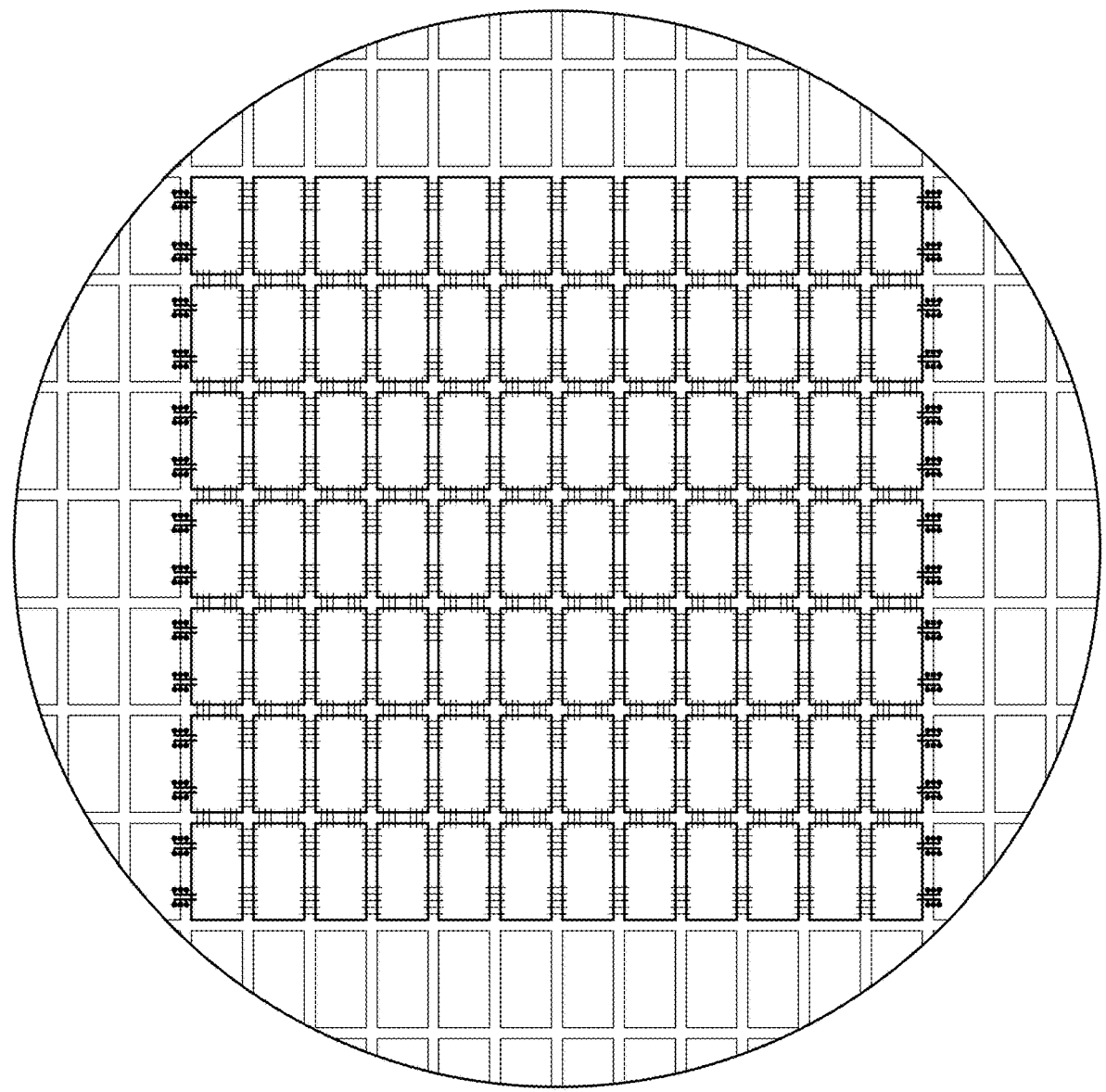
Figure 4A:
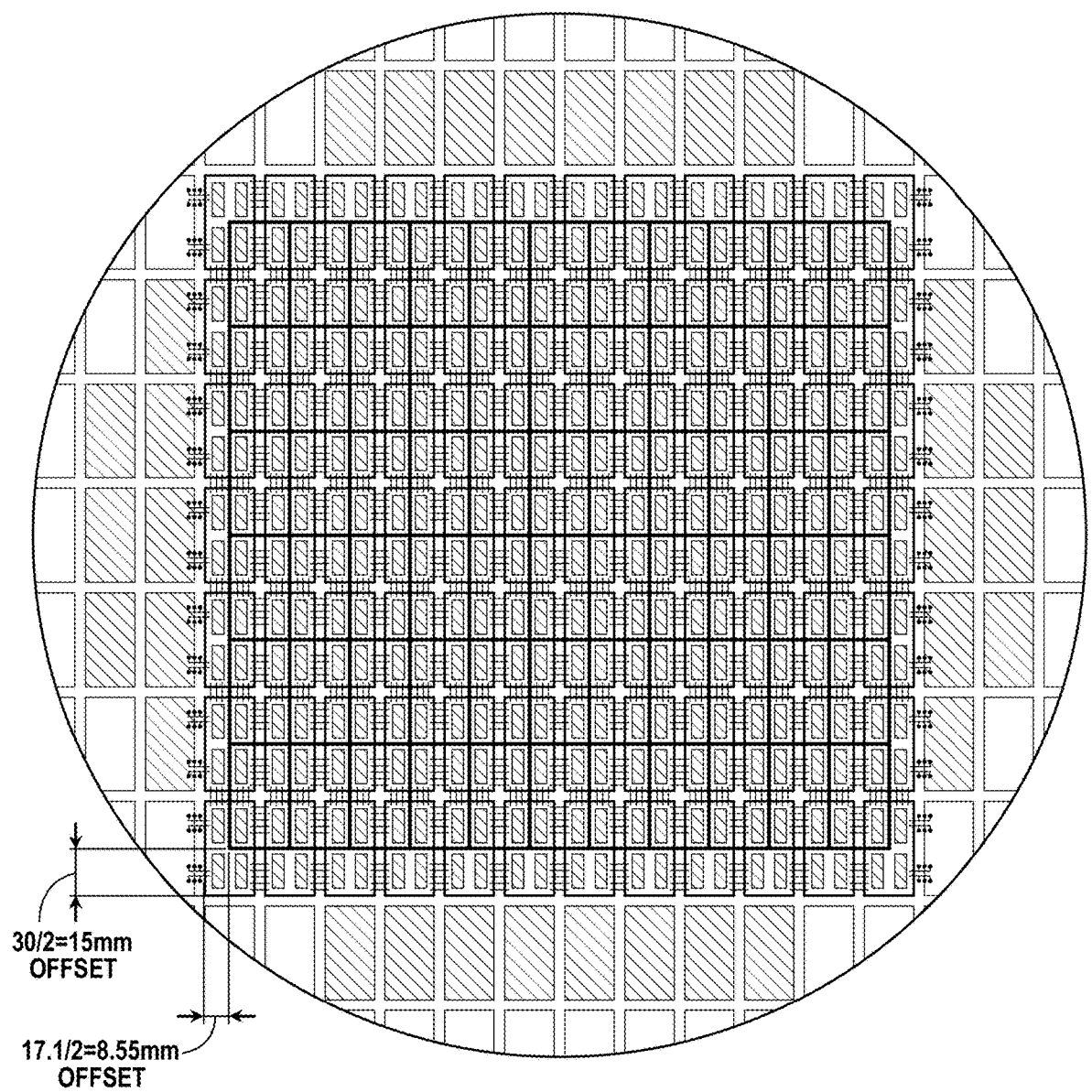
FIG. 4A-4D illustrate several schematics of a semiconductor substrate during exposure processes and size reduction in accordance with one or more embodiments of the present application.
Figure 4B:
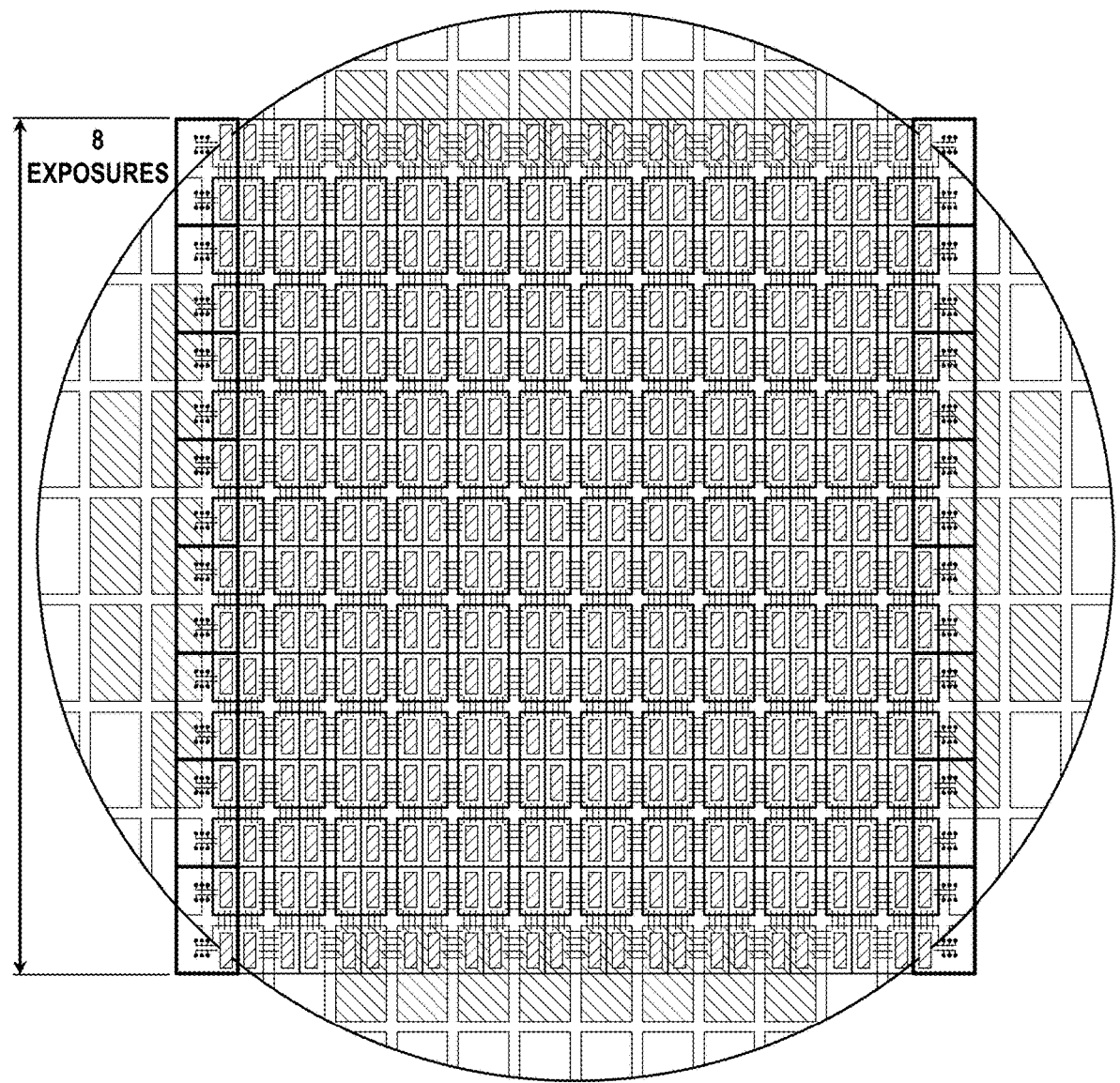
Figure 4C:
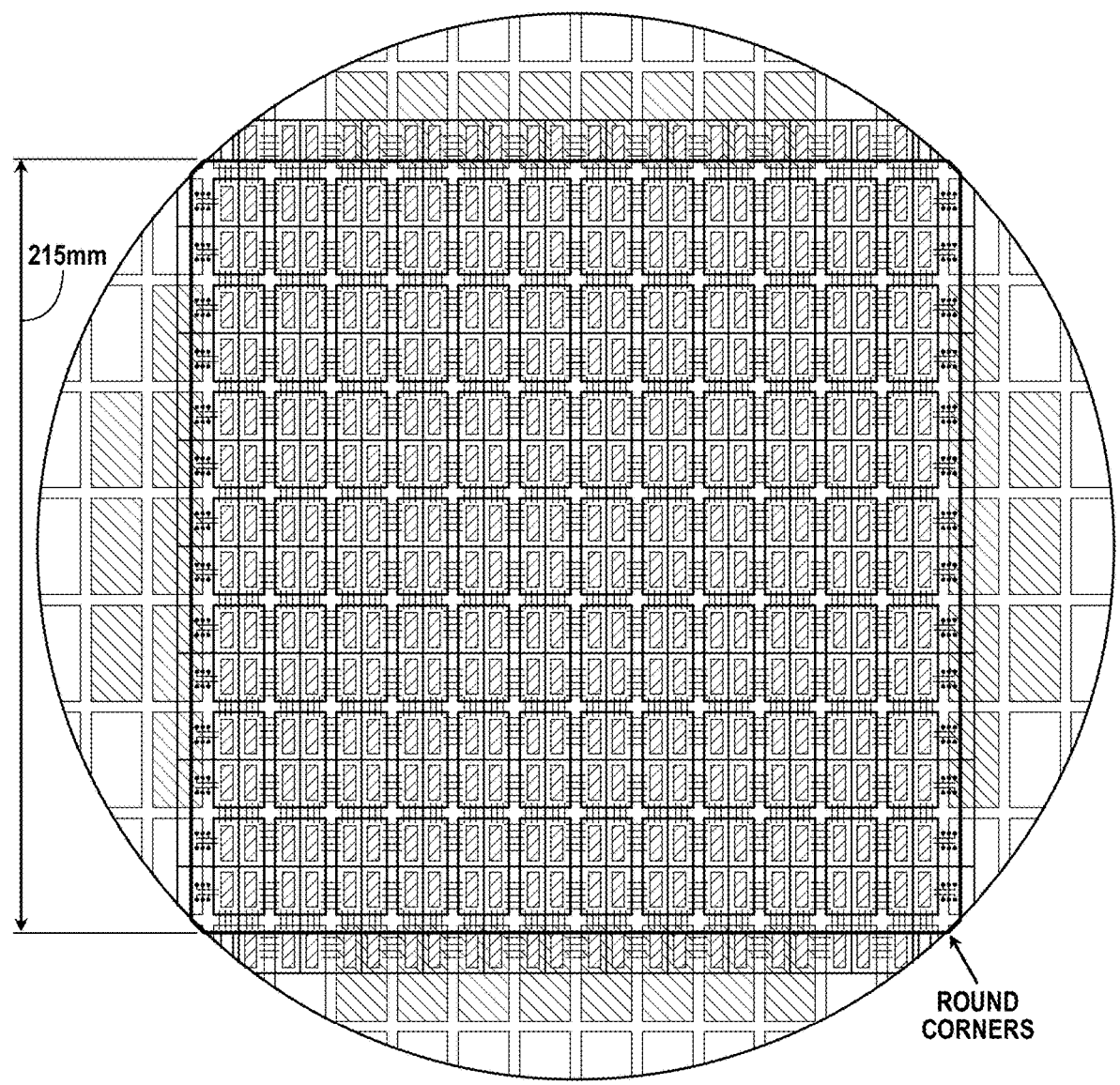
Figure 4D:
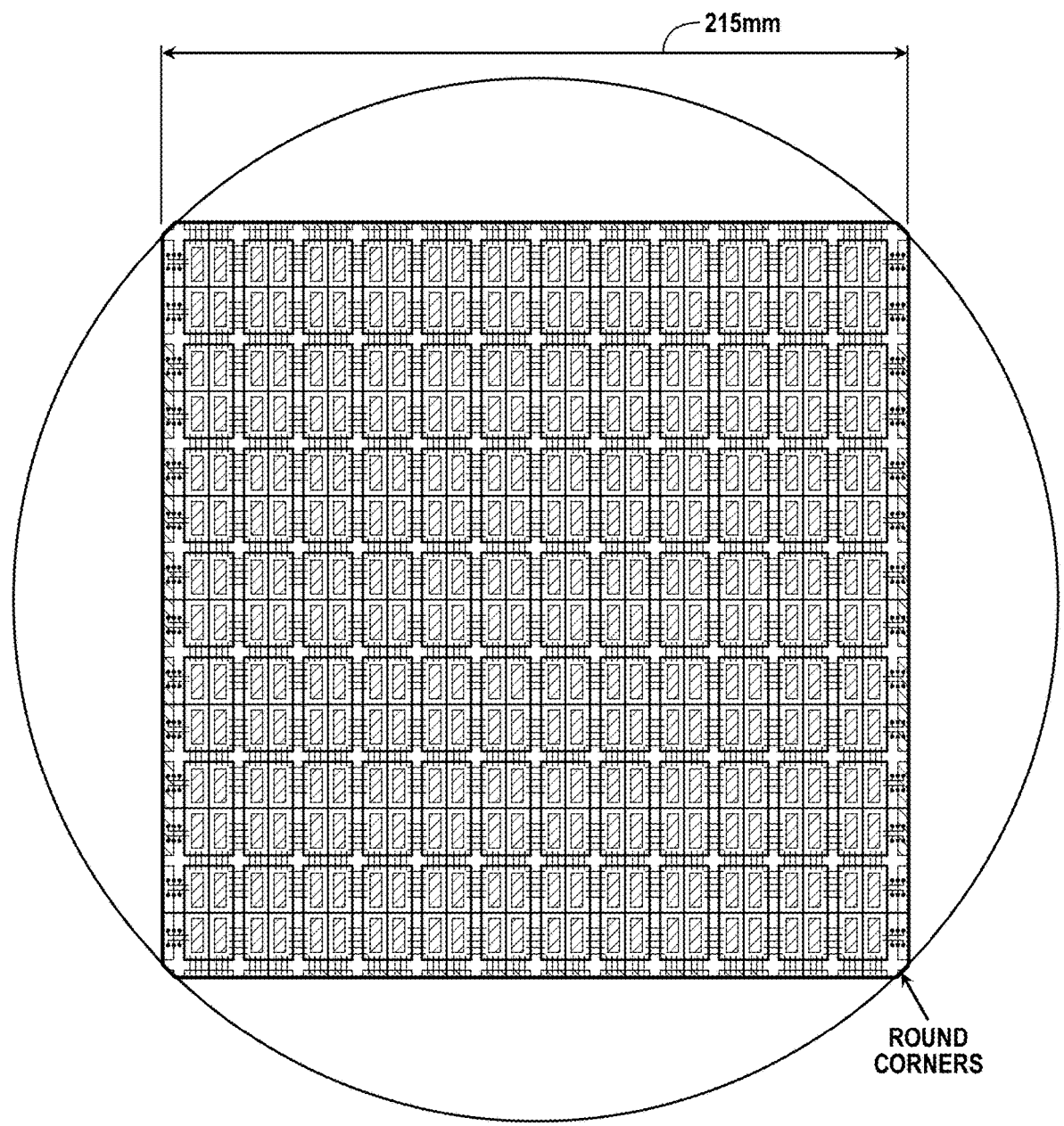

The following description of preferred embodiments of the present application are not intended to limit the inventions to these preferred embodiments, but rather to enable any person skilled in the art of to make and use these inventions.

1. Overview 1.1 Die Connectivity

Traditional integrated circuit manufacturers may prepare a single silicon wafer with many die formed on the silicon wafer. Once each die is formed on the silicon wafer, the integrated circuit manufacturer may then separate each die on the silicon wafer by physically cutting the wafer and having each die separately packaged into a chip. In some cases, the manufacturer may install several of those disparate or separate chips onto a same printed circuit board (PCB) to form an assembly and provide connections between the disparate chips so that they may communicate across the PCB assembly. The communication connections between the chips may typically be found in the PCB. However, when a multi-chip PCB is manufactured in this manner, the communication between disparate chips thereon becomes limited by the amount connectivity or bandwidth available in each connection between the disparate chips because the chips are in indirect communication via the PCB. The bandwidth across chips (e.g., off-chip communication) formed on separate pieces of silicon may be multiple orders of magnitude lower compared to chips that remain and communicate on a same piece of silicon or die.

The embodiments of the present application provide technical solutions that resolve connectivity, communication, and bandwidth issues of traditional integrated circuits and mainly, arising from integrated circuits manufactured on separate pieces of silicon (e.g., off-die integrated circuits). The technical solutions of the embodiments of the present application enable multiple die to be maintained on a same or single substrate (e.g., a wafer) without partitioning away each die in a wafer cutting process and further, while also establishing direct communication connectivity between adjacent die on the single substrate. Accordingly, the embodiments of the present application function to provide die-to-die connectivity on a single substrate or wafer.

The resulting substrate, however, has multiple die and consequently becomes a very large computer chip. Therefore, several technical problems relating to operational yield of the die on the large chip, packaging of the large chip, and powering/cooling of the large chip must also be solved. U.S. Patent Application Ser. No. 62/536,063, which is incorporated by reference herein in its entirety describes technical solutions to these related technical problems.

1.2 Packaging and Coefficient of Thermal Expansion Mismatch

As alluded to in section 1.1, the fabrication of multiple die on a single substrate or wafer produces a very large die or resulting computer chip. While the connectivity of the multiple die to form a single large die on a single substrate and improved bandwidth across the substrate may be achieved according to the technical solutions described in U.S. Patent Application Ser. No. 62/536,063, the very large size of the resulting die then gives rise to many technical issues at the system level when packaging the very large die to a PCB, panel, or an organic substrate.

The embodiments of the present application, therefore, also provide a system and method for enabling large silicon die, like those described in section 1.1 and beyond, to be used in PCBs or organic substrates having a non-compliant coefficient of thermal expansion relative to the large silicon die.

The technical problem of CTE mismatch arises in the computer chip packaging process results from a difference in the CTE of silicon onto which an integrated circuit is fabricated and the CTE of the substrate (e.g., PCB) onto which the silicon is later attached. The mismatch in CTEs of the silicon and the PCB onto which the silicon is attached results in the expansion (when powered or heat applied) of the two materials at different rates, inducing mechanical stresses, which can lead to damage in the computer chip, usually while in use. In traditional chip packaging, it is only a single silicon die with circuitry that is attached to a PCB at a time and the relatively small size of the single silicon die may produce a small or negligible expansion mismatch with the PCB that the single silicon die is attached to. For instance, to attach a single silicon die to a PCB, small microbumps are added to a surface of the single silicon die then the silicon die is affixed to the PCB. When the single silicon die and the PCB expand at different rates due to differences in CTE properties of the materials, the microbumps can typically elastically deform and absorb the small shearing forces produced by the different expansions of the PCB and the silicon die. By contrast, when the silicon die is very large (e.g., includes multiple die), the microbumps are not capable of managing the large differences in expansion of the large silicon die and the PCB and thus, the microbumps will become damaged or cracked due to the excessive displacement of the silicon die relative to the PCB.

Additionally, in the case of a small silicon die, the PCB material may be selected such that the disparity between the CTE of the silicon die and the CTE of the PCB are reduced sufficiently for compatibility.

However, the large size of the silicon die of several embodiments of the present application exacerbates the problem of CTE mismatch. In some instances, the large silicon die described herein may be up to eighty or more times larger than a single silicon die and thus, the expansion of such a large silicon die may be compounded and the resulting expansion mismatch with a PCB onto which the large silicon die is attached is similarly compounded. Additionally, because the large silicon die may be so great, there are currently no materials that may be selected and combined to form a PCB and achieve CTE compatibility with the CTE of the large silicon die.

To address at least these technical problems, embodiments of the present application provide an elastomeric connector that is disposed between the large silicon die and a PCB or other substrate. The elastomeric connector may be capable of conducting a signal through it while placed under pressure of the system and may also be malleable. The malleability of the elastomeric connector allows for absorption of the shearing displacement between the large silicon die and the PCB. U.S. Patent Application Ser. No. 62/536,071, which is incorporated by reference herein in its entirety describes technical solutions to these related technical problems.

1.3 Substrate Securing Mechanism

As introduced in section 1.2, a large elastomeric connector may be preferable for establishing a connection between a large wafer and a corresponding PCB (or panel). Specifically, one embodiment of the described elastomeric connector includes a large piece of silicon rubber that is malleable and having a plurality of conductive elements (e.g., conductive contacts) therein. The plurality of conductive elements in the elastomeric connector preferably contacts both the PCB and the wafer when the system when placed under a compression load thereby establishing signal connectivity between the PCB and the wafer.

The compression of the combination of the wafer, the elastomeric connector, and the PCB is preferably achieved over a large surface of the compression system; however, because the wafer is thin and may be composed of relatively delicate material, the application of the compression forces for establishing the signal connectivity and also, to secure together the wafer, the elastomeric connector, and the PCB must be carefully applied during assembly and further, maintained after the assembly of the integrated circuit. At least a uniform compression system is proposed by the embodiments of the present application to achieve a required overall system compression after assembly.

In related art or traditional assembly systems, there exist no such system designed for achieving this technical uniform compression. Rather, in traditional IC assemblies, a CPU is assembled to the motherboard by placing the CPU in a socket of the motherboard. Afterward, a large clamping structure may be used to apply a clamping force to maintain the position of the CPU within the motherboard and four screws and springs may be applied to secure the CPU to the motherboard around the periphery of the CPU. This traditional process is typically done under compression but the compression is only over particular surfaces of the motherboard and CPU system. A backing plate usually composed of a strong material, such as steel (or other strong metal), may be affixed to one side of the motherboard (or PCB) because as the system is clamped, the clamping forces generate large opposing compression forces onto specific sections of the IC assembly that causes the motherboard to bow. Accordingly, to compensate for the flexibility of the motherboard, a steel backing plate having significant height or thickness may be added to the system to support or prevent the motherboard from bowing. The backing plate has to extend outside the periphery of the IC to reach and accommodate the compressing screws and springs. The backing plate has to be stiffened, and therefore thickened, as the span of compressing screws is extended and/or as the IC size, and therefore IC perimeter, is increased. The backing plate, therefore, tends to add significant weight and size to the overall structure of the IC because of the thickness and frame width around the IC of the backing plate that is required to resist the clamping forces.

In the embodiments of the present application, because the wafer, elastomeric connector, and PCB are large, significant compression forces (e.g., up to 4 tons or more of compression) may be required to achieve proper assembly and maintained system compression. If a backing plate, as used in the traditional systems were implemented, the backing plate would bow greatly and thus, a significantly larger backing plate having double or more thickness in size than a traditional backing plate would be required to prevent the PCB and IC assembly from bowing. In addition to grossly overweighting the system and increasing the size of the system (e.g., height and area) of the system, such a large backing plate would make it difficult to power the integrated circuit as it would be difficult to provide a power supply structure through such a thick backing plate.

To address at least these technical problems, embodiments of the present application provide an assembly system that provides a substantially uniform compression force across the system (without introducing an overly thick backing plate), during an assembly step, and that further enables a continued uniform compression of the system after assembly of the integrated circuit that ameliorates the tensile forces acting on the PCB, that reduces the size and weight of the overall system, and that enables sufficient or ease of access to power the integrated circuit.

1.4 Precise Fabrication of Orifices

In traditional methods for fabricating a hole in a semiconductor, lasers or other mechanical boring systems may be employed for fabricating the hole during a manufacturing of the semiconductor. The traditional methods while useful, in some circumstances, for fabricating holes in standard semiconductors, these traditional methods would fail to produce holes in a large semiconductor substrate (as described herein) with high precision and without irreparably damaging the semiconductor substrate.

In particular, to support an elastomeric connection between a large semiconductor substrate (large wafer) with multiple interconnected die and a substrate (e.g., PCB or the like), the large semiconductor substrate may be required to supply a uniform compression across an entire surface area thereof during a securing process. In several embodiments of the present application, the uniformity requirement may be achieved with a series of mechanical fasteners arranged across a surface area of the large semiconductor wafer and a wafer clamping system to uniformly apply the mechanical fasteners within the large semiconductor substrate.

Accordingly, the mechanical fastening requirement for securing the large semiconductor wafer and the substrate necessitated a further requirement to fabricate or drill holes through the large semiconductor substrate and the substrate sufficient to arrange the mechanical fastening elements. However, none of the traditional methods for fabricating a hole provide a technique that would prevent damage when drilling or fabricating a hole through a plurality of differential materials. For instance, while in many circumstances, a laser may be sufficiently precise for fabricating a hole in some materials, such as metal, the heat and intensity of a laser or drilling may damage in materials like silicon including propagating severe cracks or the like along the silicon material.

To address at least these technical problems, the embodiments of the present application provide systems and methods that enable a fabrication of a plurality of precise orifices arranged along a surface of a large semiconductor without damaging a silicon component of the semiconductor substrate.

2. An IC with Inter-Die Connections and an Elastomeric Connector Assembly 2.1 IC with Inter-Die Connections As shown in FIG. 1, a semiconductor 100 illustrates an example integrated circuit having a substrate 110, a plurality of die 120 formed with the substrate 110, a circuit layer 125, a plurality of inter-die connections 130, and scribe lines 140.

The semiconductor 100 may be manufactured using any suitable lithography system that is configured to implement the one or more steps of the methods described herein, including method 200.

The semiconductor 100 functions to enable inter-die communications between the plurality of die 120 formed with the single substrate 110. The inter-die connections 130 formed between adjacent die on the substrate 110 improves communication bandwidth and enables a reduction in communication latency between connected die on the substrate 110 because communication between each of the plurality of die 120 is maintained on a same large die (e.g., on-die communication). That is, the inter-die connections 130 formed between the plurality of die 120 effectively eliminate a need to for a first die of the plurality of die 120 to go off-die (which increases latency due to transmission of signals using an intermediate off-die circuit) to establish communication with a second die of the plurality of die 120 since the first and the second die may be directly connected with one or more inter-die connections or, at a minimum, indirectly connected via intermediate inter-die connections established between one or more die between the first and the second die. Such configuration(s), therefore, enabling increasedly faster communications and data processing between die when compared, at least, to communications between die not maintained on a same substrate (e.g., a same wafer). Each of the plurality of die 120 remain on the single substrate 110 and are not cut from the substrate 110 into individual dice for separate packaging into an individual computer chip. Rather, at formation, only excess die (e.g., die that are not provided with circuitry or inactive die) along a periphery of the substrate 110 are preferably removed from the substrate 110 and the remaining portions of the substrate 110 having the plurality of die 120 (e.g., active die) may form a predetermined shape (e.g., a rectangular shape) with the substrate 110. The resultant substrate 110 after being reduced to shed excess die and potentially following one or more additional refinement or IC production processes may then be packaged onto a board (e.g., a printed circuit board (PCB) or an organic substrate).

The substrate 110 is preferably a wafer or a panel into and/or onto which die having a circuitry layer 125 on which microelectronic devices may be built. The circuitry layer typically defines one or more surfaces on a die onto which circuits and various microelectronic devices may be fabricated using a lithography system. The substrate 110 is preferably formed of a silicon material (e.g., pure silicon), but may be additionally or alternatively formed of any suitable material including silicon dioxide, aluminum oxide, sapphire, germanium, gallium arsenide, an alloy of silicon and germanium, indium phosphide, and the like. The substrate 110 may be a virgin wafer. Alternatively, the substrate 110 may include one or more layers formed therein where the one or more layers may include, but not limited to, a photoresist, a dielectric material, and a conductive material. The photoresist being light-sensitive material may include any material that may be patterned by a lithography system. The photoresist may be positive photoresist or negative photoresist.

Accordingly, the substrate 110 may be formed of any thin slice of semiconductor material that may be used for fabrication of integrated circuits having varying diameters and shapes, but preferably the substrate 110 is formed in a circular shape and with a diameter of 300 mm.

The lithography system may refer to any lithography system that prints images of a reticle onto a substrate (e.g., a wafer) using light. The lithography system may be a scanning projection system or a step and scan system, which may be alternatively referred to as a scanner or a stepper. The lithography system may include any suitable exposure system including one or more of optical lithography, e-beam lithography, X-ray lithography, and the like.

The microelectronic devices, such as transistors, diodes, various circuits, and the like may be formed into and/or over the substrate 110 using lithographic processes (e.g., optical lithography, etc.).

Each of the plurality of die 120 may be a block of semiconducting material on which circuits may be fabricated. Each of the plurality of die 120 may be formed by an exposure process of silicon material of or on the substrate 110 and typically in a rectangular shape or square shape. However, it shall be noted that the die 120 may take on any suitable form including any geometric and non-geometric forms. Other than excess die that is removed from the substrate 110 during a substrate reduction process, the plurality of die 120 are not cut or diced from the substrate 110 into individual dice.

Additionally, each of the plurality of die 120 includes an alignment point preferably at a center of each die. The alignment point may be used by the stepper of the lithographic system to align the photomask and/or photoreticle with respect to each of the plurality of die 120 before an exposure process. Further, each of the plurality of die 120 may include a seal ring surrounding or covering a periphery (perimeter) of each of the die other than the circuitry layer (e.g., circuit fabrication surface) of each dice. Accordingly, the seal ring may be provided at the side surfaces of each dice which extend in a normal direction (i.e., perpendicular) with respect to the surface of the substrate 110 and further, located adjacent scribe lines 140. The seal ring functions to protect each dice from various contaminants or particulates that may potentially impregnate or enter a dice.

The plurality of inter-die connections 130 function to connect, at least, any two circuits (e.g., the inter-die connections may connect a transmitting circuit and receiving circuit of two die, respectively) between two die of the plurality of die 120 on the substrate 110. That is, each inter-die connection 130 may be formed or provided to extend from a first dice to a second dice located on the substrate 110. Preferably, an inter-die connection 130 may be formed between two adjacent die. Each inter-die connection may be formed of a material having a length and an endpoint at each respective end of the length of material (e.g., two endpoints), where each respective endpoint terminates at a circuitry layer of a different dice on the substrate 110.

In the case that the die are formed in a rectangular or similar geometric or substantially geometric shape, the inter-die connections 130 may extend between two parallel or substantially parallel surfaces of the two-adjacent die. Accordingly, it is possible for a single dice of the plurality of die 120 to be connected to more than one dice depending on the positioning of the dice in the array of die on the substrate 110. When positioned in an interior of the substrate 110, the single dice of the plurality of die 120 may be adjacent to four other die having at least one surface that is parallel to one of the four side surfaces of the single dice where one or more inter-die connections 130 may be formed. It shall be understood that while in preferred embodiments it is described that the die may be formed as a rectangle (or other polygon), the die may be formed in any shape or manner suitable for preparing an integrated circuit including non-traditional, non-geometric or non-polygonal shapes.

The plurality of inter-die connections 130 (global wires) are preferably wires or traces that function to conduct signals across two die. The plurality of inter-die connections 130 are preferably formed of a same conductive material used to form intra-dice connections (or local wires) between circuit elements of a single dice. Additionally, or alternatively, the plurality of inter-die connections 130 may be formed of any suitable conductive material that may be the same or different from materials forming other wires on a dice or that may be the same or different from materials forming the circuits on the dice.

In a preferred embodiment, the plurality of inter-die connections 130 are formed by offsetting the stepper of a lithographic system a predetermined distance from a center or alignment point of a single dice sufficiently to allow an exposure to be performed for and between two adjacent die rather than an exposure focusing on the circuitry layer 125 of an individual dice. Consequently, the exposure(s) that provide the inter-die connections 130 may be formed over the scribe lines 140. Additionally, the endpoints of an inter-die connection 130 may be positioned or formed at interior position relative to a location of the seal ring of a dice. Accordingly, while the inter-die connections 130 may be formed at any suitable location between two die, the inter-die connections may be typically formed such that the respective endpoints of an inter-die connection 130 are positioned inwardly of the seal ring of the dice on which it terminates such that each respective endpoint of an inter-die connection 130 is positioned at some location between the seal ring and a center of the respective dice.

The scribe lines 140 (or saw street) function to indicate a location between two disparate die on the substrate 110 where the substrate 110 would typically be cut for forming individual dice. The scribe lines 140 may typically be centered between two or adjacent die and in many cases, have a width similar to a width of a saw used for cutting wafers and the like. In a typical circumstance, no circuitry or other elements would be formed on or over the scribe lines 140, as these elements would most likely be severed or damaged during a cutting process of the substrate 110.

As shown in FIG. 2, a method 200 for producing a large semiconductor having a plurality of die and a plurality of inter-die connections includes providing a semiconductor substrate S210, fabricating one or more circuitry layers on a plurality of die of the substrate S220, fabricating a plurality of inter-die connections S230, and reducing a size of the semiconductor substrate. The method 200 may optionally or alternatively include identifying a largest square of the substrate S215 and providing a protective barrier encompassing portions of the plurality of die S225.

Further, FIGS. 3A-3D illustrate several schematics of a semiconductor substrate, such as semiconductor 100, without and with interconnections. FIGS. 4A-4D illustrate several schematics of a semiconductor substrate, such as semiconductor 100, during exposure processes and size reduction.

2.2 Elastomeric Connector Assembly

Figure 5:
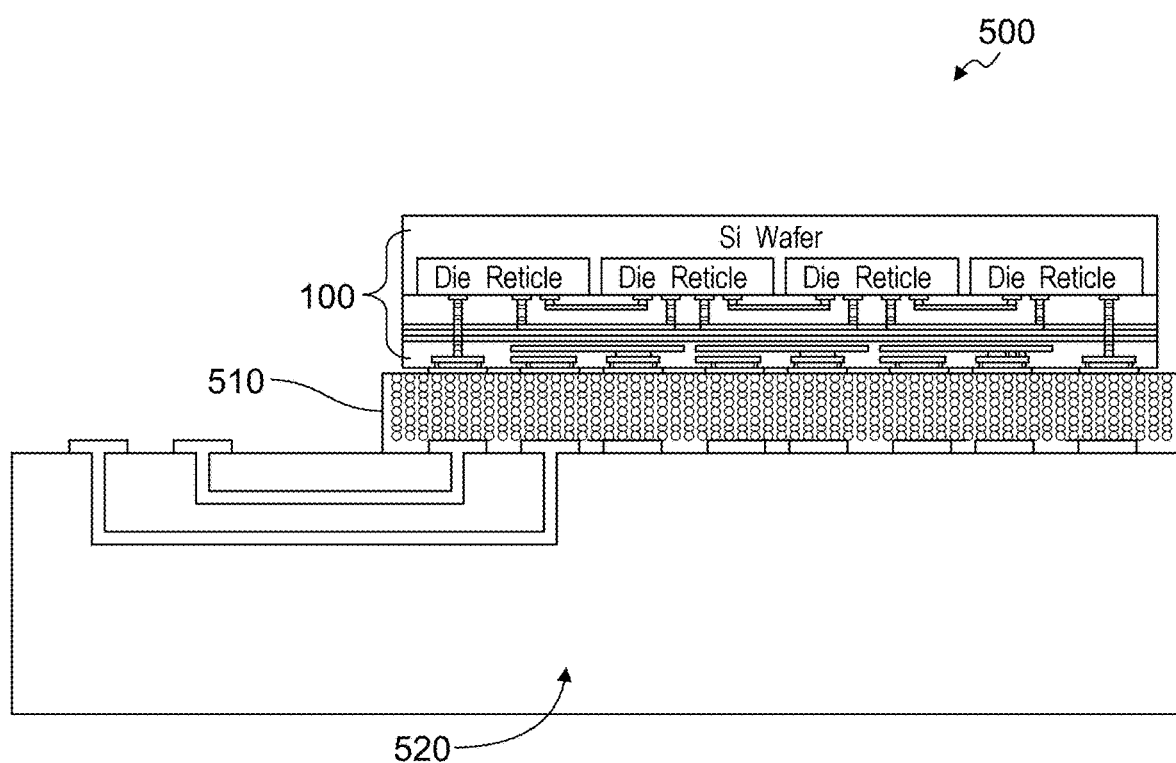
FIG. 5 illustrates a semiconductor assembly 500 in accordance with one or more embodiments of the present application.

As shown in FIG. 5, a schematic of a semiconductor assembly 500 includes an elastomeric connector 510 disposed between the semiconductor 100 and a circuit board 520.

The elastomeric connector 510 functions to secure the large semiconductor 100 to a circuit board 520. The elastomeric connector 510 preferably functions to place the semiconductor 100 and circuit board 520 in operable signal communication by conducting signals between them in a vertical direction (a direction normal to surfaces of both the semiconductor 100 and circuit board 520). Specifically, each of the semiconductor 100 and the circuit board 520 may include one or more conductive pads. The conductive pads of the semiconductor 100 may generally oppose the conductive pads of the circuit board 520 and may also, have a one-to-one alignment with each other. The elastomeric connector 510 is preferably designed to be interposed between the opposing surfaces of the conductive pads of both the semiconductor 100 and the circuit board 520. In this way, signals provided by a conductive pad of either the semiconductor 100 or the circuit board 520 may be transmitted through the elastomeric conductor 510 to an opposite conductive pad of the other of the semiconductor 100 and the circuit board 520.

Figure 6A:
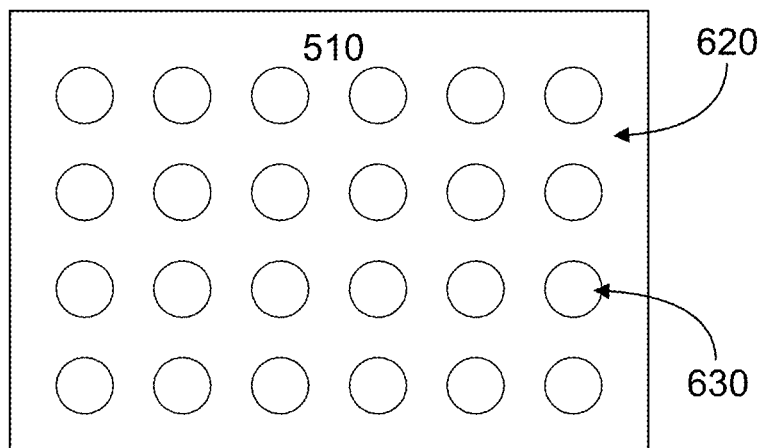
FIG. 6A-6B illustrate schematic examples of an elastomeric connector in accordance with one or more embodiments of the present application.

As shown in FIG. 6A, the elastomeric connector 510 includes a membrane 620 having a plurality of conductive elements 630. The membrane 620 may be any suitable material but is preferably made using silicon material.

Figure 6B:
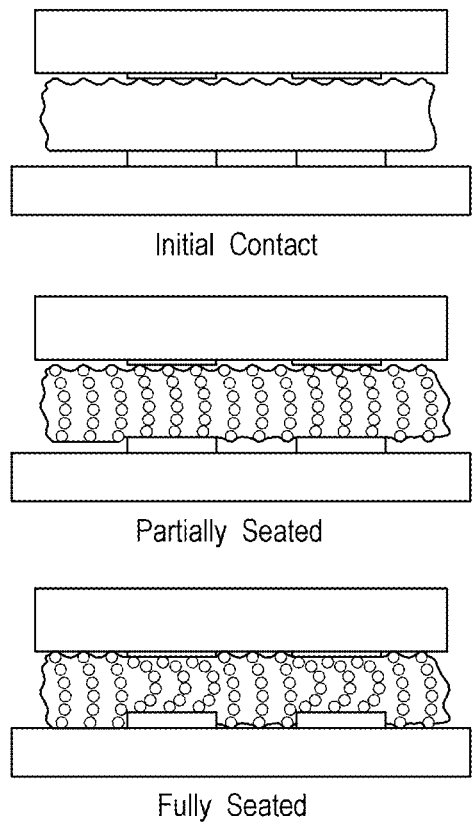

The plurality of conductive elements 630 may be any suitable conductive material that are arranged distributively and/or separately arranged within a body of the membrane 620. The plurality of conductive elements generally include a plurality of particles, such as ball wires, that when placed under compression (e.g., vertical compression) come into conductive contact with adjacent particles. That is, in a first state (of un-compression) in which the elastomeric connector 510 is not placed under a compressive load, the plurality of conductive elements 630 are preferably distributed within the body of the membrane 620 substantially (some contact) or fully independent (no contact) of each other. However, in a second state (of compression) in which the elastomeric connector 510 is placed under a compressive load, the plurality of conductive elements 630 preferably come into contact and may function to form multiple disparate conductive chains (conductive strings) or electrical paths from a first surface region of the elastomeric connector 510 to a second surface region (preferably opposing surface region) of the elastomeric connector 510 that function to electrically connect the conductive pads of the semiconductor 100 and the conductive pads at the circuit board 520. As shown in FIG. 6B, when under compression, the plurality of conductive elements 630 only make contact vertically and not horizontally. However, it shall be noted that if a laterally compressive force were applied to the elastomeric connector 510, the plurality of conductive elements 630 would similarly come into contact to form an electrical signal path between the opposing surface regions of the elastomeric connector 510.

The plurality of conductive elements 630 may, additionally, function to provide an elastic effect or spring effect in one or more portions of the elastomeric connector 510 to generally resist compressive forces, shearing forces, and/or permanent deformations in the elastomeric connector 510. Accordingly, when one or more portions of the elastomeric connector 510 is placed under a load, the plurality of conductive elements 630 may elastically compress without allowing the elastomeric connector 510 to undergo permanent deformation. That is, even after a large load (e.g., four tons of pressure or the like) the plurality of conductive elements 630 are sufficiently elastic to allow the elastomeric connector 510 to regain its original form or substantially its original form when the elastomeric connector 510 is not placed under the large load.

In the case that the plurality of conductive elements 630 comprise metal ball wires, the elastic effect is achieved when a load is placed onto the elastomeric connector 510 thereby causing the ball wires to come into conductive and elastic contact with each other. The ball wires when in contact form a substantially vertical conductive path (or in some embodiments, a lateral conductive path), as shown by way of example in FIG. 6B. Additionally, or alternatively, a vertical spring or elastic chain in which the adjacent ball wires forming the vertical conductive path and spring may be permitted to slide against each other in a horizontal direction (e.g., in a direction normal to a direction of a load) and in the vertical direction (albeit slightly) while maintaining continuous contact. In some embodiments, adjacent surfaces of the ball wires, when in contact, are permitted to slide against each other in the conductive and elastic path allows the conductive and elastic path to shift (while maintaining conductive and elastic contact) and form an arc. The arc formed by the ball wires while under a compressive load may have varying radii along the arc. Additionally, the arcs formed by horizontally adjacent vertical conductive and elastic paths may have similar or different arcs depending on an amount of load applied thereon.

The arc-shaped configuration of the ball wires when placed under a compressive load preferably allows for significant deformation (e.g., beyond some deformation threshold) of the elastomeric connector 510 while allowing the ball wires to maintain signal communication between the semiconductor 110 and the circuit board 520 and also, allow the ball wires to elastically resist variable shearing forces along the elastomeric connector 510 by allowing radii along the signal conductive path or conductive chain formed thereby to shift or change according to varying shearing forces applied to the various sections of the signal conductive path. That is, because the semiconductor 100 may expand or contract at a different rate than the circuit board 520, shearing forces experienced along top portion or region of the elastomeric connector 510 may be different than the shearing forces experienced along a bottom portion or region of the elastomeric connector 510. Accordingly, the resulting shearing forces experienced along the signal conductive path formed by the plurality of ball wires (e.g., the plurality of conductive elements) may also vary from a top region to a bottom region of the elastomeric connector 510.

Further yet, the plurality of conductive elements 630 while under compression and while maintaining conductive contact function to enable a shearing force absorption effect while maintaining signal conductivity between the semiconductor 100 and the circuit board 520. A shearing effect or shearing force against the elastomeric connector 510 may generally be caused by a disparity between the CTE of the circuit board 520 and the semiconductor 100. The semiconductor 100 being preferably made of silicon material typically may not vary greatly, in terms of expansion (expands approximately at 3 parts per million) or contraction, during heating or cooling. The circuit board 520, however, which may include materials such as copper may expand and contract at a different rate (e.g., 17 parts per million). Of course, because the semiconductor 100 is large the corresponding circuit board 520 is large so that a heating effect (when powered) applied to the assembly 500 may mainly causes the circuit board 520 to expand so greatly relative to the semiconductor 100 on the opposite side of the elastomeric connector 510 to cause to a large shearing force and resulting shearing effect on the connector 510.

However, as mentioned above, the configuration of the ball wires (e.g., roundness or substantial roundness) allows the balls to shift or slide against each other and thereby absorb and resist the shearing force caused due to the heating of the circuit board 520 and the semiconductor with mismatched CTEs.

Figure 7:
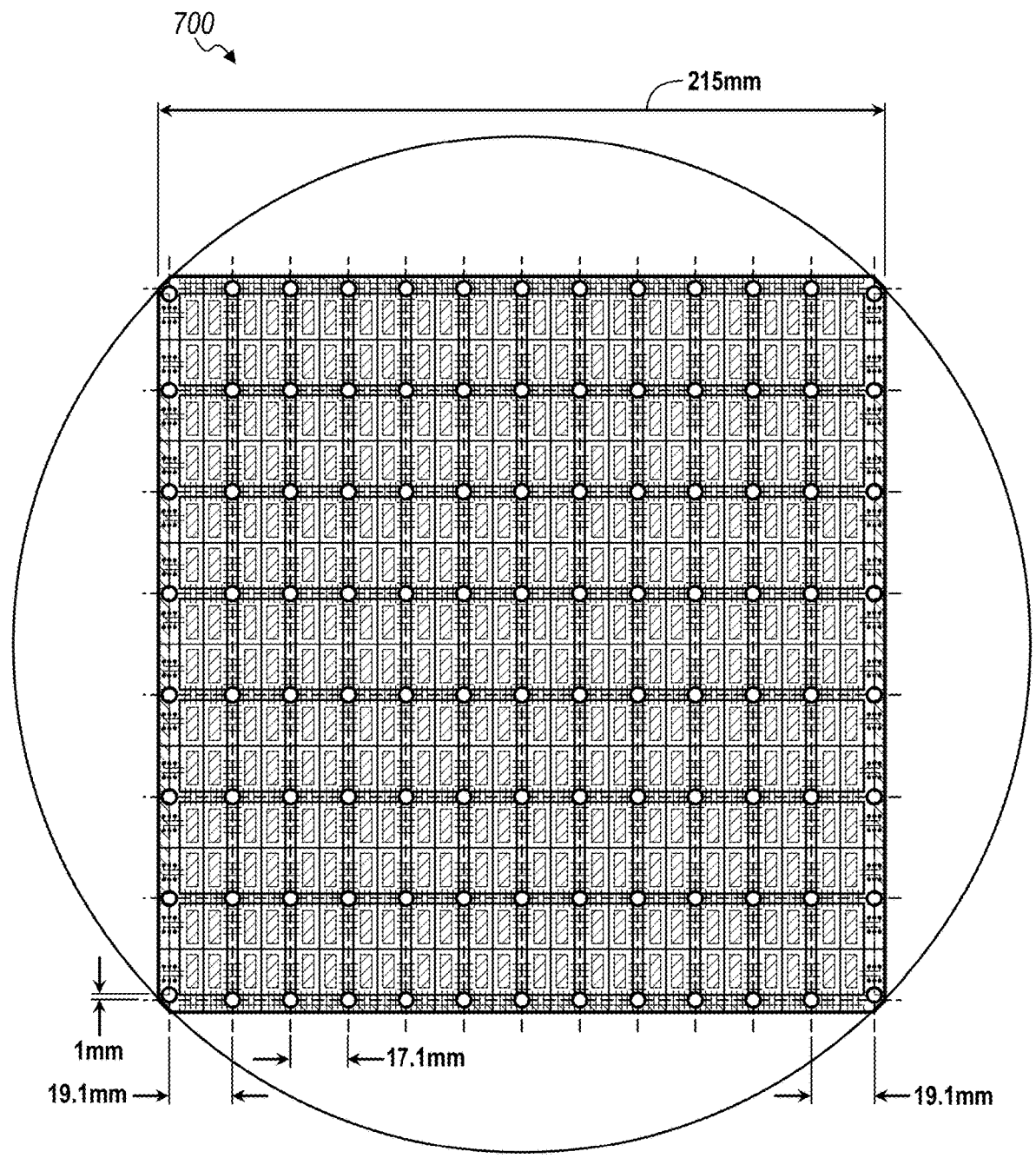
FIGS. 7-7A illustrate schematics of a large substrate in accordance with one or more embodiments of the present application.
Figure 7A:
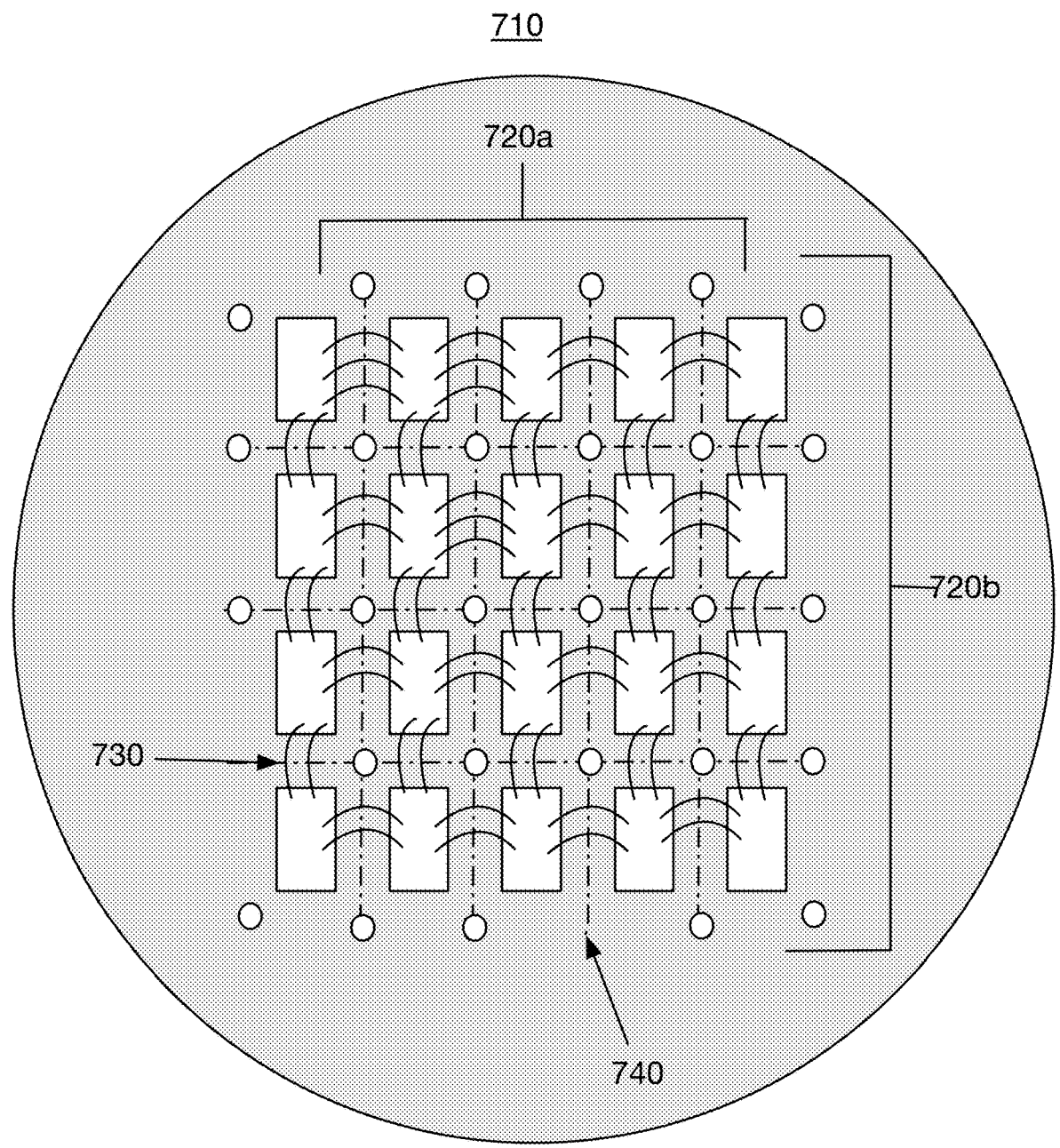
Figure 8:
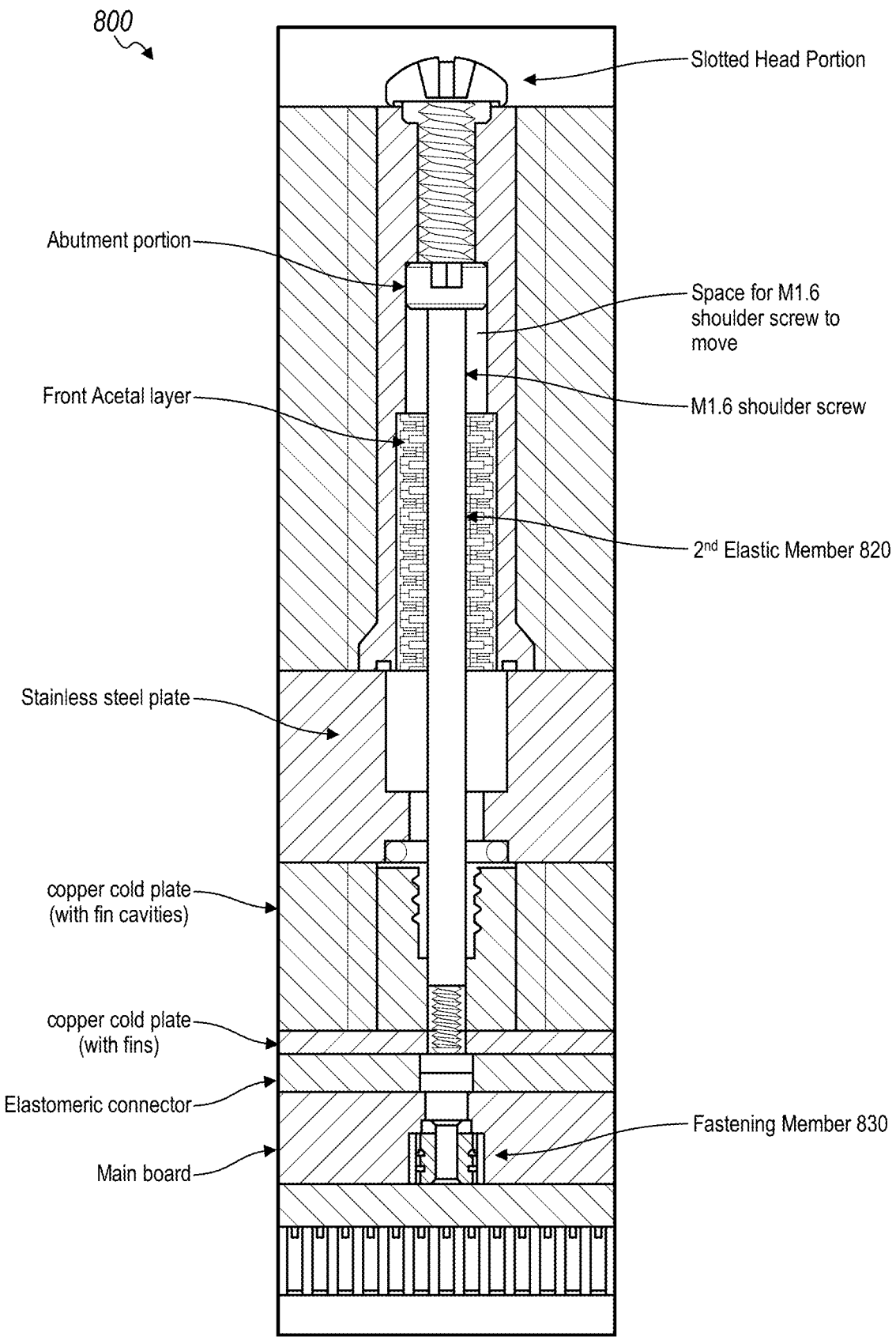
FIG. 8 illustrates a schematic of a securing element 800 in accordance with one or more embodiments of the present application.

3.0 Systems and Methods for Securing an IC Assembly
3.1 an Array of Orifices for Securing the IC Assembly Referring to FIGS. 7-7A, FIGS. 7-7A illustrate a large substrate 710 (e.g., a large wafer) designed with a plurality of die having inter-die connectivity. In some embodiments, the large substrate 710 may have a same or similar configuration as the substrate 110 described with respect to FIGS. 1-2 of the present application.

Figure 10:
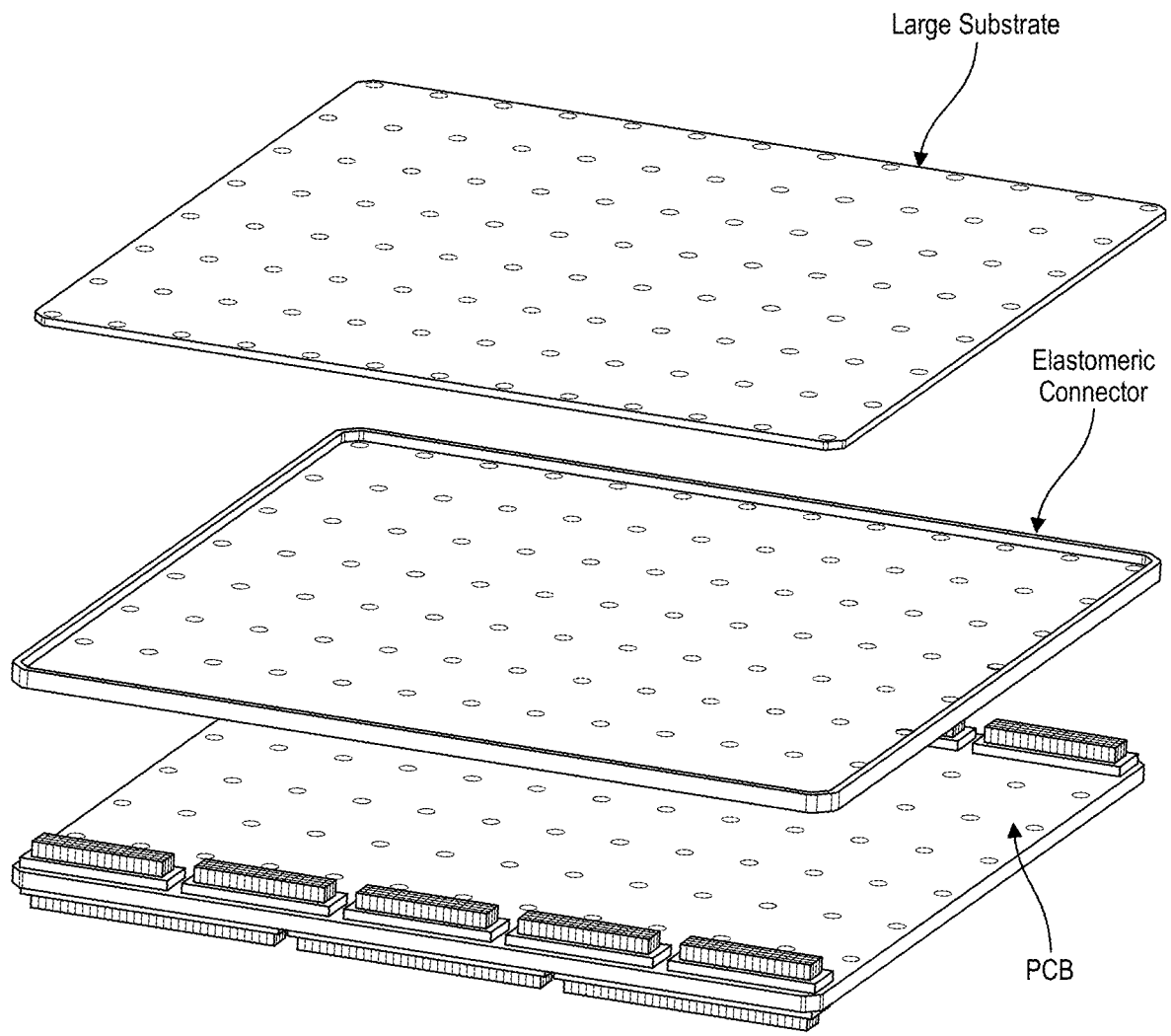
FIG. 10 illustrates some components of an IC assembly in accordance with one or more embodiments of the present application.
Figure 11:
FIG. 11 illustrates a method 1100 in accordance with one or more embodiments of the present application.

The large substrate 710 may be configured with a plurality of orifices 720 across a surface of the large substrate. The plurality (or array) of orifices 720 may be centered based on a center of the large substrate 710. The plurality of orifices 720 may include a plurality of through holes and/or cavities fabricated within one or more layers of an IC assembly. The configuration of the plurality of orifices 720 may depend on the material and a position of the material in the IC assembly, as shown in FIG. 10, in which a respective orifice 720 is formed. For instance, within the large substrate 710, each of the plurality of orifices 720 may be a through hole that is configured to receive a securing element 800. In another example, within a PCB or panel forming an assembly component of the IC assembly, the plurality of orifices 720 may defines a plurality of cavities configured to receive a terminal end of the securing element 800.

Additionally, or alternatively, the plurality of orifices 720 may be defined by a combination of intermediate orifices 720a and periphery orifices 720b. Referring to FIG. 7, the intermediate orifices 720a may include an array of orifices positioned along the substrate 710 between a left lateral column of periphery orifices 720b and a right lateral column of periphery orifices 720b. Each of the intermediate orifices 720a is preferably positioned at a respective corner of a die of the substrate. In some embodiments, at interior position of the substrate, a respective intermediate orifice 720a may be positioned at a respective corner of at least four die. That is, four die may share a respective intermediate orifice 720a at one of their respective corners. The intermediate orifice 720a may be positioned on the substrate 710 such that the orifice abuts the corner of the die. Alternatively, the intermediate orifice 720a may be disposed with a slight gap between itself and the die to avoid damage to the die either during the fabrication of the intermediate orifice 720a or during the process of securing the IC assembly components together with a securing element 800 or the like.

Additionally, or alternatively, the plurality of orifices 720 (including intermediate and periphery orifices) may be positioned or centered on the scribe lines 730, 740 of the substrate 710. That is, in some embodiments, a scribe line may run along a line defining a diameter of each respective orifice 720. In the case of the intermediate orifices 720a, each intermediate orifice 720a may be positioned at corners of a plurality of die while being centered at an intersection of scribe lines 730, 740. Accordingly, an intersection of a vertical (740) and a horizontal scribe line (730) should define a center of intermediate orifice 720a. Positioning the plurality of intermediate orifices 720a in this manner along the scribe lines and at the corner of the die functions to avoid any logic circuitry that may be positioned along the scribe lines 730, 740 and between pairs of die. In many embodiments, the logic provided to the substrate 710 are preferably not formed at the corner areas of the die of the substrate 710.

Additionally, with respect to the intermediate orifices 720a, the distance or pitch between any pair of intermediate orifices 720a, along a given direction, on the substrate 710 should be the same. For example, each pair of intermediate orifices 720a along a horizontal direction of the substrate 710 may be a predetermined pitch of 17.1 mm or the like. The pitch would measure a distance between each respective center of the pair of intermediate orifices 720a. Similarly, along a longitudinal direction of the substrate 710, the predetermined pitch between intermediate orifices 720a may be a predetermined pitch of 30.0 mm or the like.

The periphery orifices 720b are preferably defined by the outermost lateral columns of orifices of the substrate 710. The periphery orifices may function to laterally encapsulate the intermediate orifices 720a. Additionally, or alternatively, the periphery orifices may be disposed such that the pitch between a pair of orifices defined by a single intermediate orifice 720a and a single intermediate orifice 720b, along a horizontal direction with respect to the substrate 710, is larger than the predetermined pitch between a pair of intermediate orifices 720a. For instance, the pitch, in the horizontal direction, between a mixed pair of orifices may be a predetermined pitch of 19.1 mm rather than 17.1 mm.

Additionally, the predetermined pitch between the pairs of intermediate orifices 720a and the mixed pair of orifices may be designed specifically to reduce a tensile force applied to a PCB and/or backing element (e.g., a backing plate, cooling plate, etc.) when the IC assembly components are clamped together. Specifically, the predetermined pitch for the pairs of orifices are preferably positioned sufficiently close to avoid unnecessary tensile stress to the PCB and backing element components of the IC assembly. In this way, bowing of the PCB and the backing element may be avoided during compression of the IC assembly. Otherwise, if a larger pitch is used, a larger backing element may be required to resist the tensile stress of compression and to further prevent bowing of the PCB and backing element.

3.2 Securing Elements for an IC Assembly

For each of the plurality of orifices 720, a securing element 800 is provided that is configured to compress the large substrate 710 together with various other IC assembly components, including at least a PCB component and an elastomeric connector.

Preferably, the securing element 800 comprises a shoulder screw prior to insert into and bottomed to a fastening member, such as nut. In a preferred embodiment, once the shoulder screw 800 is installed, a shoulder of the shoulder screw 800 may come into contact with a body of a fastening member (e.g., fastening member 830) and a screw head of the shoulder screw 800 may come into contact with one or more elastic members (e.g., the elastic members 820, Bellville springs, etc.). In this preferred embodiment, the contact of the shoulder of the shoulder screw 800 to a body or top surface of the body of the fastening member may cause the screw head to come into contact with the one or more elastic members thereby partially compressing the one or more elastic members with the screw head. As mentioned above, the shoulder screw may include a slotted head portion (e.g., a screw head) and an extending member that extends from an opposite surface of the slots in the head portion. Threading may be formed at a distal end (or along a surface) of the extending member of the screw. An abutment portion of the shoulder screw may be positioned along the extending member and spaced a longitudinal distance away from the slotted head portion. Additionally, the shoulder screw may include a mechanical gasket (e.g., an integrated O-ring) that functions to close an access hole of the orifice and seal the shoulder screw cavity.

Additionally, the securing element 800 includes an elastic member 820 that functions to allow the securing element 800 to be compressed and decompressed various amounts from a first position to a second position (and, reversely). Specifically, each of the components forming the IC assembly (e.g., the IC stack) may vary in dimensions according to an environment or operating status of the resulting integrated circuit. For instance, according to temperature variations within the IC stack, the components forming the stack may expand when the temperature increases and contract when the temperature decreases. To account for the variation and to avoid damage to the IC assembly, the elastic member 820 may be disposed between a pressure applying portion of the securing element 800 and a surface of a component in the IC stack. In this way, the expansion and contraction of the stack is absorbed (or accommodated) in the compression and decompression of the elastic member 820. The elastic member 820 preferably comprises a plurality of Bellville springs positioned between a surface of the abutment portion of the shoulder screw and a surface of a backing element (e.g., a stainless-steel plate). The plurality of Bellville springs may be stacked consecutively against each other with the top Bellville spring contacting a pressure applying portion of the securing element 800 and a bottom Bellville spring contacting a surface of a component of the IC assembly.

Additionally, a technical benefit in utilizing a plurality of Bellville springs stacked together includes the ability to spread an expansion load across each of the disparate Bellville springs in the stack of Bellville springs. That is, when the temperature of the IC assembly causes an expansion or the like of the component therein, the expansion load may be applied to each Bellville in the Bellville stack with near equal force or loading. Because the expansion load is spread among each of the Bellville springs in the stack, this prevents the elastic member 820 from bottoming out. Once another type of spring or similar elastomeric spring (other than a Bellville spring) bottoms out, the pressure from expansion in the IC assembly can no longer be accommodated by such device and may result in the components of the IC assembly being adversely affected (e.g., breaking, cracking, bending, etc.) by the expansion loading.

It shall be noted that the elastic member 820 may be any type of elastic device capable of storing mechanical energy. For instance, in one implementation, the elastic member 820 may comprise a coil spring (or any other suitable elastomeric spring).

Additionally, or alternatively, a fastening member 830 may be provided at the PCB or panel of the IC assembly for fastening the securing element 800. Preferably, the fastening member 830 comprises a nut with a threaded hole that is configured to receive the terminal end with threading of the securing element 800. The fastening member 830 may be disposed within (e.g., embedded) the PCB or panel of the IC assembly. Alternatively, the fastening member 830 may be disposed on one side of the PCB or panel of the IC assembly.

The one side of the PCB may be a surface of the PCB that is opposite an entry surface of the PCB where the securing element 800 enters the PCB.

Additionally, or alternatively, the securing element 800 may be configured such that when the securing element 800 is secured into the fastening member 830, a shoulder of the securing element 800 rests against a surface of the fastening element 830 and thus, providing a fixed distance between the fastening element 830 and the slotted head portion of the securing element 800.

3.3 Pressing/Clamping Assembly

Figure 9:
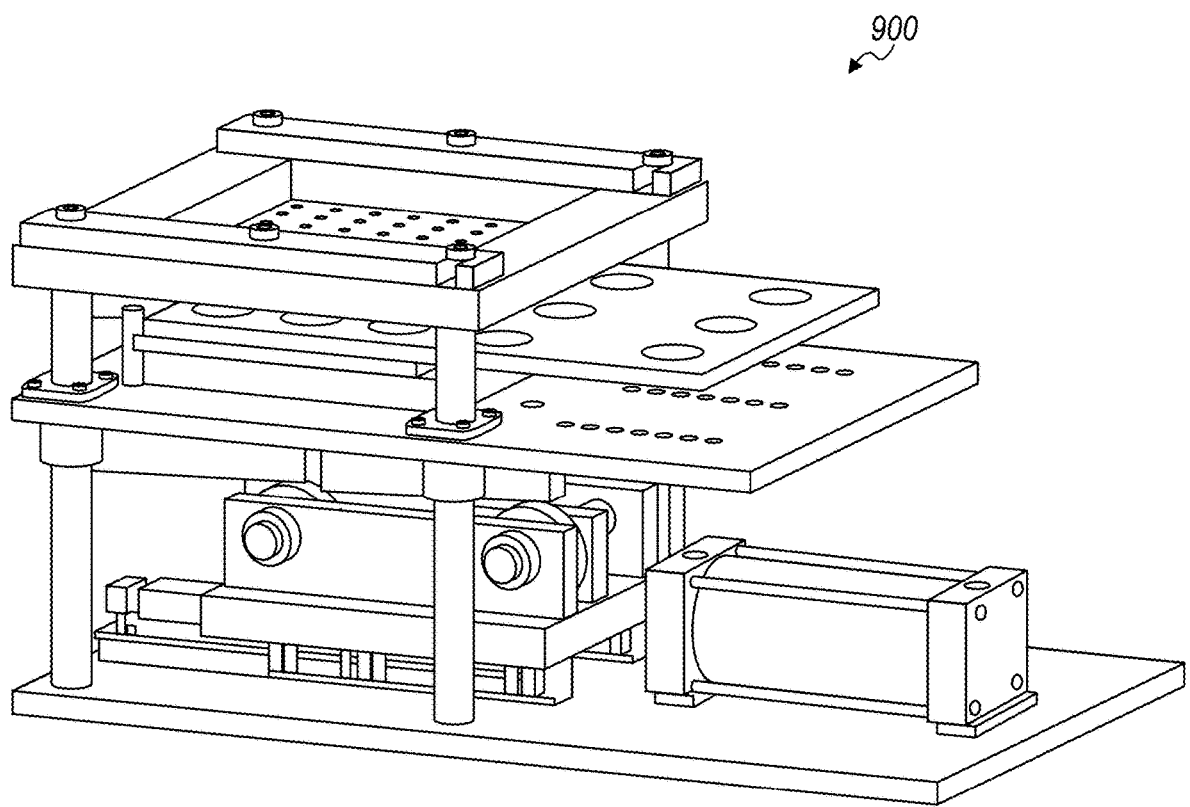
FIG. 9 illustrates a schematic of a pressing assembly 900 in accordance with one or more embodiments of the present application.

As shown in FIG. 9, a clamping assembly 900 is provided for assembling together the components of the IC assembly. The clamping assembly 900 may include a load application component that is configured to apply a mechanical load (e.g., up to four tons or more) against one or more components of the IC assembly. The clamping assembly 900 may also include a mechanical securing component that is configured to enable fastening of the securing element 800 of the IC assembly.

In use, the clamping assembly 900 may first apply a mechanical compression load to the elastic member 820 and once a desired mechanical load is achieved, the clamping assembly (or other device) may be triggered to fasten the securing elements 800 into the IC assembly. Specifically, the mechanical load applied by the clamping assembly 900 may be uniformly applied between the fastening members 830 of supporting members of the substrate or PCB and to the elastic members 820 distributed throughout the IC assembly at locations at which a plurality of the securing elements 800 are inserted. Additionally, or alternatively, each securing element 800 may be inserted and fastened until a shoulder of the securing element 800 comes into contact with the fastening member 830 and no further (i.e., a minimum force and torque may be applied to the securing element 800 that allows it to travel through the elastic member 820 until the shoulder of the securing element 800 comes into contact with the fastening member 830). In other words, a compression of the elastic member 820 may not be provided by torque applied to the securing element 800, but rather, by the clamping assembly 900 until the securing element 800 may be fastened into position, at which time the clamping assembly 900 may release a pressure which may be transferred to the securing element 800. Attempting to fasten each securing element 800 into place while moving against an opposing pressure of the elastic member 920 would cause it to be very difficult to maintain uniform pressure across the IC assembly during the securing process when using the torque or the orientation of the securing element. Instead, a uniform pressure may be applied (to the elastic members 820) by the clamping assembly 900 via another means and structure until all the securing elements 800 are in place and therefore, a compression distance, as defined by a distance between center points (e.g., a longitudinal center extending through a head portion of securing element 800) of two adjacent securing elements 800 across an IC assembly may be set.

Additionally, the clamping assembly 900 may be configured to enable synchronous fastening of the plurality of securing elements 800 into the IC assembly. For instance, in some embodiments, one hundred four (104) securing elements 800 may be used for securing together the IC assembly. In such embodiments, the clamping assembly 900 may be configured to simultaneously fasten all 104 securing elements 800 into the IC assembly to ensure a uniform load is applied by the securing elements 800. The clamping assembly 900 may function to release the mechanical loading once the securing elements 800 are fastening or fastened into position.

3.4 A Method of Securing an IC Assembly

As shown in FIG. 1100, a method 1100 for securing an integrated circuit assembly includes providing the IC assembly components 1105; arranging the IC assembly components S1110; providing a plurality of securing elements to the IC assembly S1120; implementing a pressing process S1130, fastening the plurality of securing elements within the IC assembly S1140; and terminating the pressing process S1150.

S1105, which includes providing the IC assembly components, functions to configure each of the assembly components for receiving a plurality of securing elements. Specifically, S1105 functions to prepare the IC assembly components by fabricating (e.g., drilling, etc.) a plurality of orifices within each of the IC assembly components for receiving a plurality of securing elements. Accordingly, S1105 may function to fabricate in each of the IC assembly components (e.g., the large substrate (wafer), the elastomeric connector, the PCB, the cooling plate, etc.) a same number of orifices that may be placed in alignment when the IC assembly components are stacked together. In some embodiments, S1105 may function to fabricate and position the orifices along the surfaces of each of the IC assembly components according to a first predetermined pitch along a first direction (e.g., a horizontal direction) of the IC assembly and according to a second predetermined pitch along a second direction (e.g., a longitudinal direction) of the IC assembly. Alternatively, S11005 may function to fabricate and position the plurality of orifices using a same pitch across the IC assembly.

Additionally, or alternatively, S1105 may function to provide alignment markers or alignment points within each of the IC assembly components that enable each of the IC assembly components to easily be placed in alignment with each other.

S1110, which includes arranging the IC assembly components, functions to arrange each of the IC assembly components in order and in alignment, preferably, within a pressing assembly. Specifically, S1110 may function to logically order the IC assembly components to enable signal connectivity (once compressed) and place the IC assembly components in an alignment position with respect to each other that enables an insertion of respective securing elements within the aligned orifices of the IC assembly components. As shown in FIG. 10, S1110 functions to position (or sandwich) an elastomeric connector between the large substrate and a PCB in such a manner that each of the orifices of each IC assembly component is aligned along a central axis formed through respective orifices of the large substrate, the elastomeric connector, and the PCB. The IC assembly, of course, can include other components, such as steel plates (for support), and cooling plates (e.g., a heat sink) that may also be placed in alignment as described in accordance with S1110.

S1120, which includes implementing a pressing process, functions to initiate a pressing of one or more components of the IC assembly preferably using a pressing apparatus. Prior to or contemporaneously with a provisioning of the securing elements, S1120 functions to compress a plurality of elastic members (e.g., Bellville springs) at each of the aligned orifices. Accordingly, a predetermined mechanical load may be applied to each stack of elastic members that enables the insertion and fastening of the securing elements without a significant force. That is, S1120 enables the fastening of the securing elements without counter forces of the stack of elastic members working against the fastening process.

S1130, which includes providing securing elements to the IC assembly, functions to insert each of a plurality of securing elements into the aligned orifices of the IC assembly. Accordingly, while one or more components of the IC assembly may be under compression (e.g., the elastic members), S1130 functions to insert a securing element within each of the available orifices. As mentioned above, inserting the securing elements into the orifices in this manner enables an efficient fastening process (e.g., use of minimal torque) of the securing elements because potentially counter forces of the elastic member may be temporarily neutralized.

S1140, which includes securing the plurality of securing elements within the IC assembly, functions to implementing a fastening process of the plurality of securing elements preferably while one or more components of the IC assembly may be under a mechanical compression load by the pressing assembly. Thus, once the plurality of securing elements are inserted into the IC assembly, S1140 may function to mechanically fasten each of the plurality of securing elements into the IC assembly and preferably, until a portion (e.g., threaded portion) of each of the plurality of securing elements is fastenedly placed within a respective fastening member (e.g., mechanical nut) at the PCB. S1140 may function to stop a fastening process of each securing element once a shoulder of the securing element abuts a surface of a fastening member or an IC assembly component.

Responsive to a fastening of each of the plurality of securing elements into the IC assembly, S1150, which includes terminating the pressing process, functions to release or terminate the mechanical loading applied to the elastic members. The termination of the mechanical loading enables each of the stacks of elastic members to decompress to a position that abuts a pressure applying surface of the securing element.

It shall be noted the systems and methods described herein for clamping and securing an IC may be applicable to any type and/or size of substrate or wafer and thus, the embodiments of the present application should not be limited to large substrates, such as large substrate 710. As an example, the systems and method clamping and securing an IC may be applied to reconstructed wafers in addition to non-cut wafers (e.g., large multi-die wafers, etc.). A reconstructed wafer may be constructed or reconstituted according to various processes. In one instance, a reconstructed wafer may be constructed of a wafer carrier in which singulated die have been assembled to the wafer carrier. In another instance, a reconstructed wafer may be made of an array of die embedded in a molded compound that provides mechanical support the combination of which may be tantamount or equivalent to a wafer fabricated according to standard processes (including the novel processes described herein).

4. Method of Precision Fabrication of Orifices in an Active Integrated Circuit

Figure 12:

As shown in FIG. 12, a method 1200 of a high precision fabrication of orifices in a large semiconductor substrate includes adding a sacrificial layer of material to the large semiconductor substrate S1210, removing a first depth of material(s) from the large semiconductor substrate S1220, and removing a second depth of material(s) from the large semiconductor substrate S1230. Optionally, the method 1200 may include removing the sacrificial layer of material S1225 and pre-processing the large semiconductor substrate to reduce a thickness thereof S1235.

The method 1200 includes a multistage process for accurately fabricating a plurality of orifices with precision in a large semiconductor wafer while safely reducing or eliminating damage to a silicon layer of the large semiconductor substrate. In a preferred embodiment, the method 1200 may function to first implement a laser drilling process at a first stage sufficient to safely remove a metal layer of a semiconductor substrate having an active circuit layer. In the method 1200, the laser drilling may be applied to remove all metal material in a predetermined direction and with a first predetermined radius until a second material of the semiconductor substrate is reached or exposed. The first predetermined radius preferably extends along a width direction of the metal layer to or before reaching seal rings surrounding one or more active layers of the semiconductor substrate. At the second material of the semiconductor substrate, the method 1200 may function to implement a second and different etching process that does not produce a heat affected zone in immediate areas surrounding a position of the etching. The combination of the etching techniques of the method 1200 allow for a fast and precise fabrication of orifices in a large semiconductor substrates with limited to no damage to the components of the substrate, namely the silicon layer.

S1210, which includes adding a sacrificial layer of material to the large semiconductor substrate, functions to deposit a film or a coating of sacrificial material onto the large integrated circuit wafer. The sacrificial layer of material preferably functions as a protective layer that operates to protect a surface of a metal layer of the large semiconductor substrate from damage and/or pollution by particulate matter resulting from a fabrication of one or more orifices in a first surface of the large semiconductor substrate. Accordingly, S1210 preferably functions to add the sacrificial layer of material onto a surface of the large semiconductor surface in advance of orifice fabrication process, which includes the removal of a first depth of material as described in S1220.

In one preferred embodiment, S1210 may function to add the sacrificial layer of material using a spin coating technique in which the sacrificial layer of material is added to a surface of the large semiconductor substrate and spun to spread the material along the surface of the substrate. It shall be noted that any suitable coating or film application process may be employed in S1210 for adding the sacrificial layer of material including spray deposition, vapor deposition, and/or any combination thereof.

Additionally, any suitable material may be employed in S1210 for producing the sacrificial and/or protective layer over a surface of the large semiconductor substrate. Additionally, or alternatively, preferably the material of the sacrificial layer comprises a material that may be chemically removed without damaging the one or more metal components or layers and/or the silicon components or layers of the large semiconductor device.

S1220, which includes removing a first depth of material(s) from the large semiconductor substrate, functions to implement a first stage of fabricating an orifice in a large semiconductor substrate that includes applying a material removal process or technique at a first surface of the large semiconductor substrate for removing at least a metal layer (e.g., an active circuitry layer) from the large semiconductor substrate. Preferably, S1220 removes the first depth of material from the large semiconductor substrate using a high accuracy, laser ablation process. The laser process applied in S1220 may function to remove an upper section of metal structures and associated dielectric layers from the large semiconductor substrate for fabricating an orifice having a predetermined radius within the large semiconductor substrate. Accordingly, the removal of the first depth of material preferably functions to remove the sacrificial layer at the point of application of the laser ablation process as well as a predetermined depth of the metal layer of the large semiconductor substrate.

It shall be noted that while in one or more preferred embodiments the one or more removal techniques for removing material from the large semiconductor substrate may operate to remove material using a predefined radius, the method 1200 may use any defined shape other than a radial-based shape, such as a circle or the like, to define a target removal area of the semiconductor substrate. That is, any shape or form may be used to define the target removal area for a given semiconductor substrate or the like.

In one implementation, S1220 may function to remove a first depth of material from the large semiconductor substrate that includes a section comprising a full depth of a metal layer. That is, in such implementation, S1220 may function to apply a laser ablation to section of a metal layer, beginning at a top surface of the metal layer and ending the laser ablation once a bottom surface of the metal layer at the section is completely removed. In this implementation, the laser ablation may be completed once the entirety of the metal layer for a given section is removed and a top surface of a second material, such as a silicon layer, of the semiconductor substrate is exposed. Accordingly, the first depth comprises a depth of the metal layer or a top layer preceding a silicon layer of the large semiconductor substrate.

Figure 14:
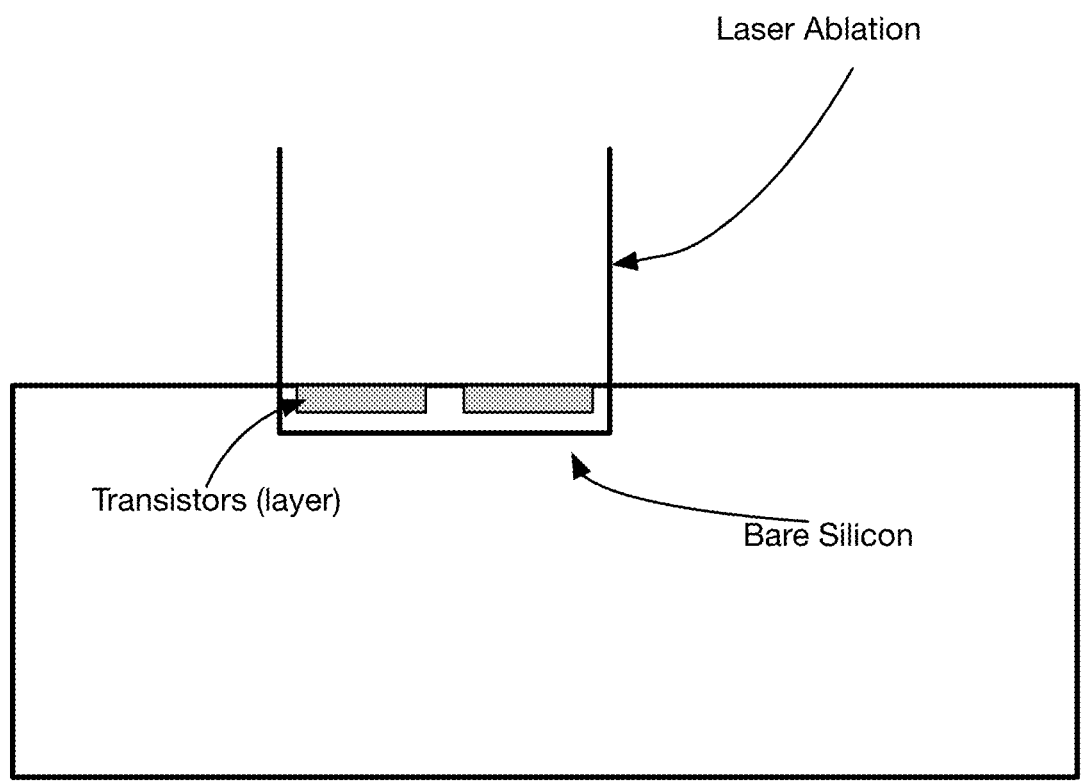
FIG. 14 illustrates a schematic of a partial semiconductor substrate having a laser ablation to a depth including a transistor layer in accordance with one or more embodiments of the present application.
Figure 15:
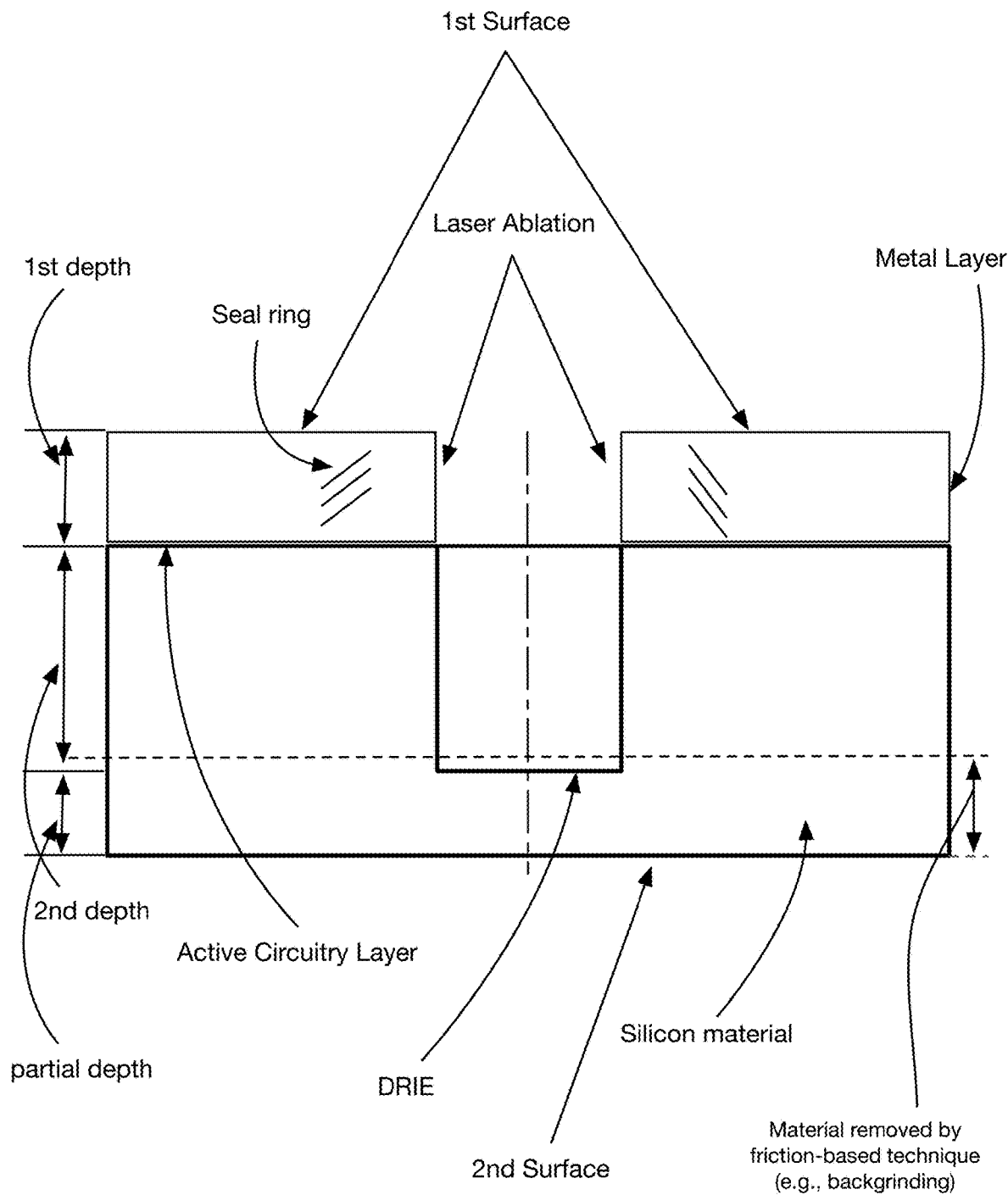
FIG. 15 illustrates a schematic of a semiconductor substrate onto which singulation is performed thereon in accordance with one or more embodiments of the present application.
Figure 16A:
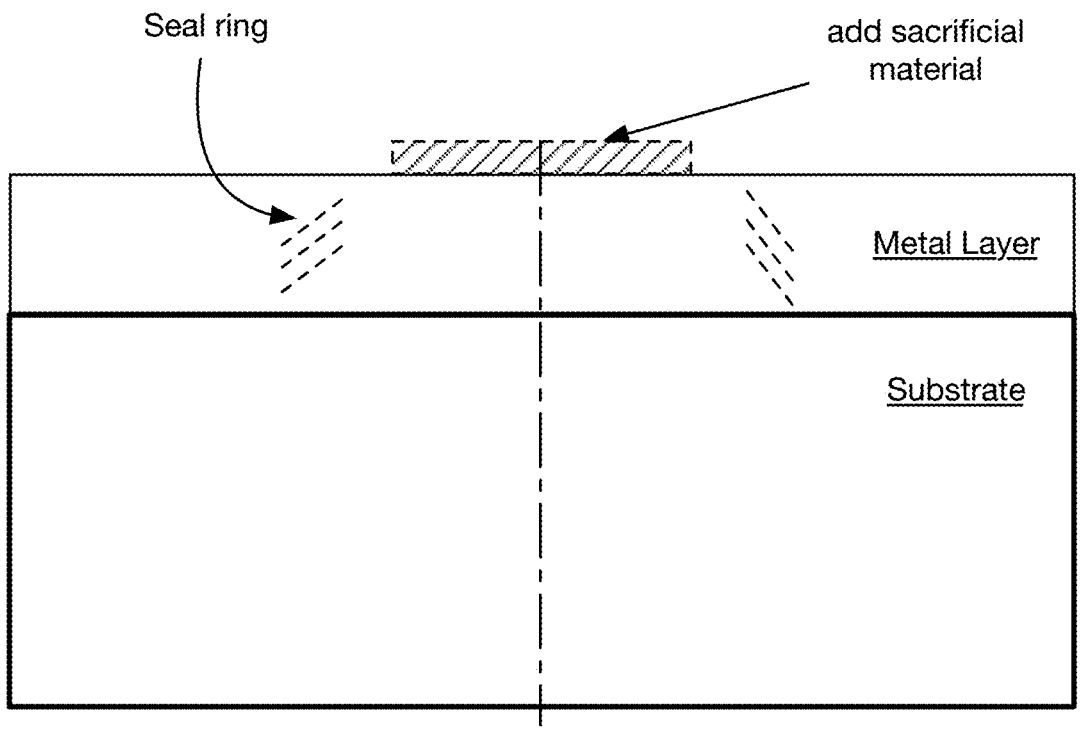
FIGS. 16A-C are schematic representations of a first, second, and third process of an example of the method, respectively.
Figure 16B:
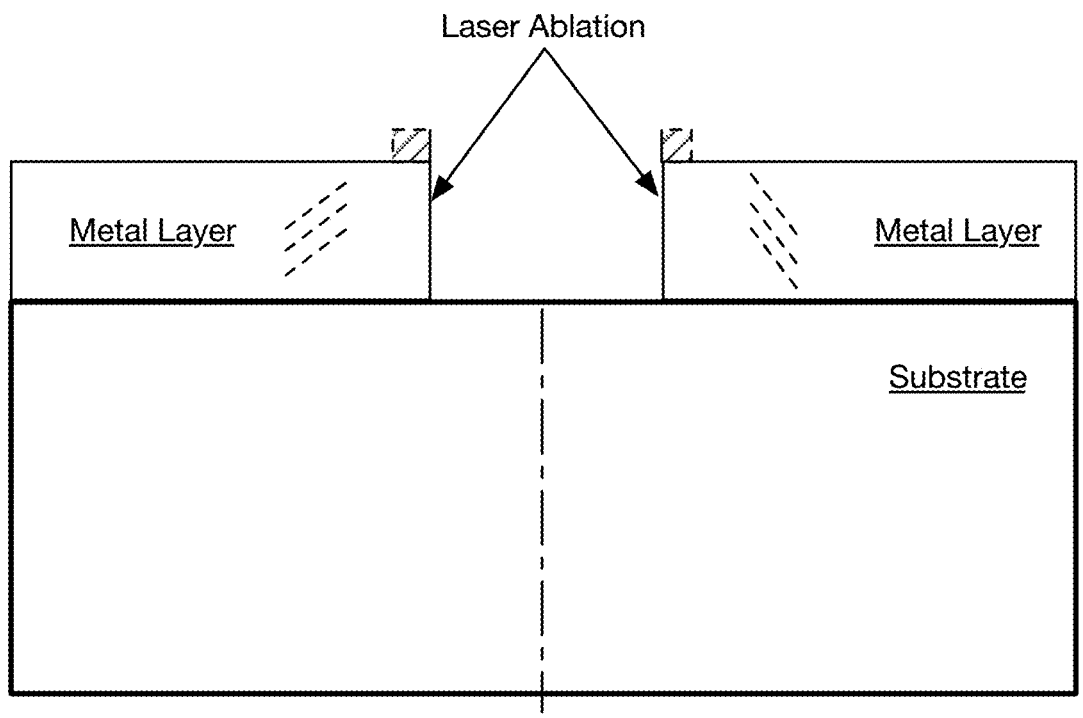
Figure 16C:
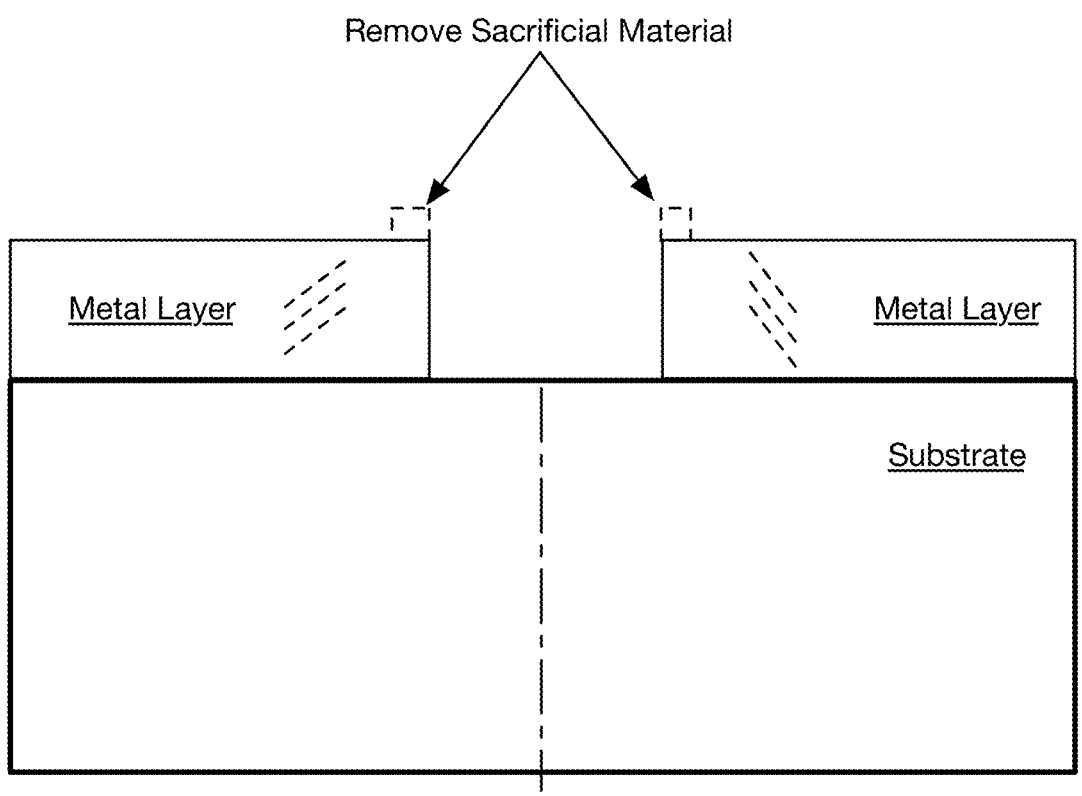
Figure 17A:
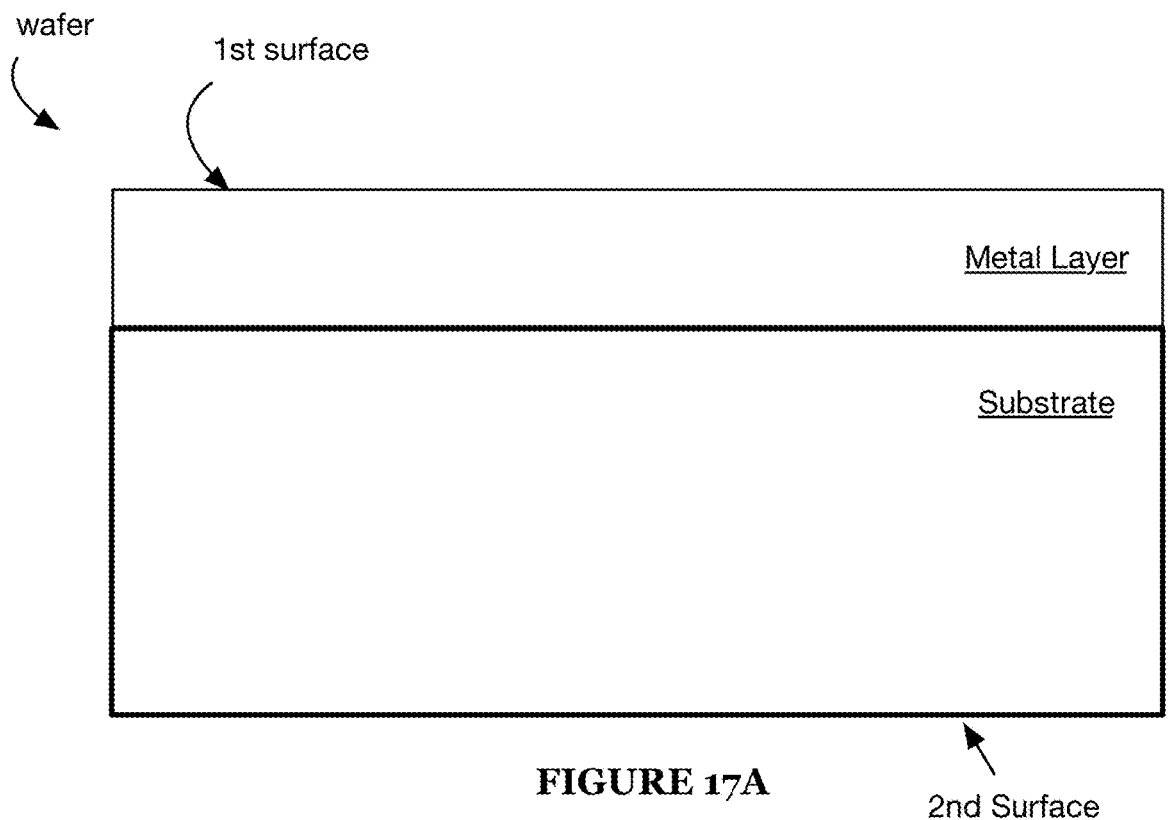
FIGS. 17A-D are schematic representations of a first, second, third, and fourth process of an example of the method, respectively.
Figure 17B:
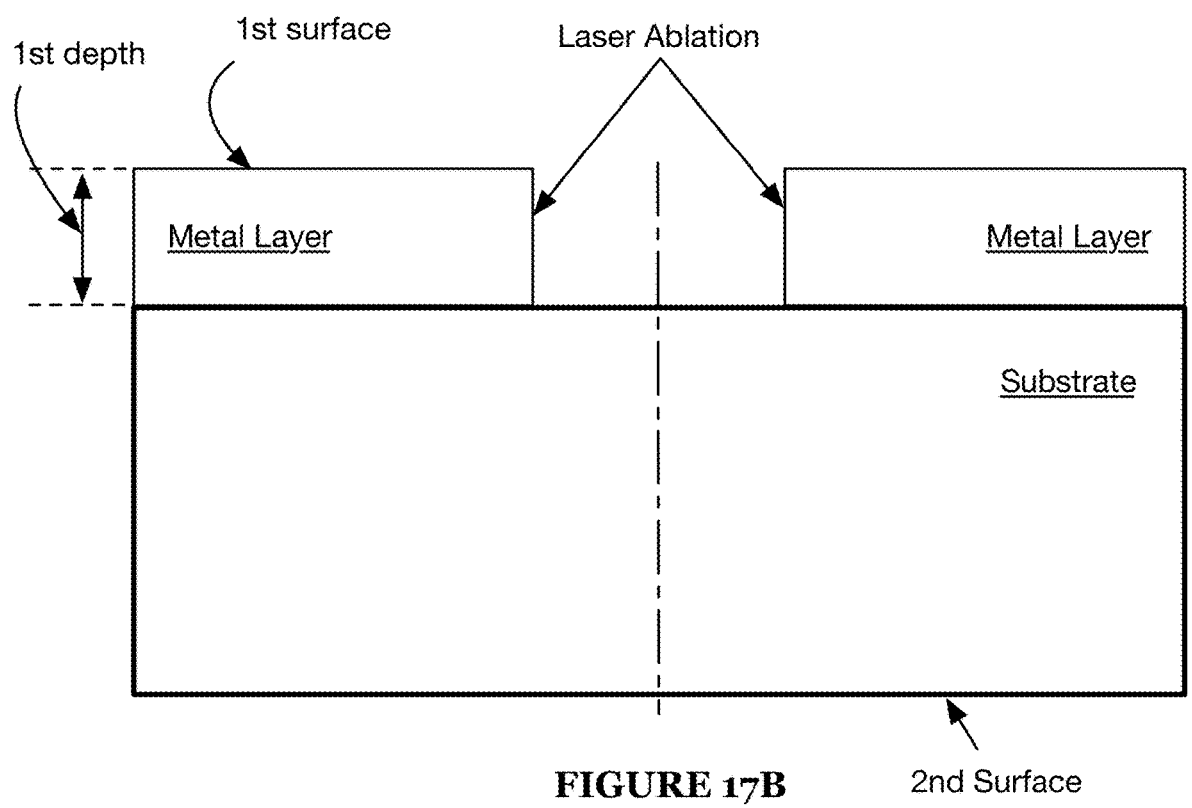
Figure 17C:
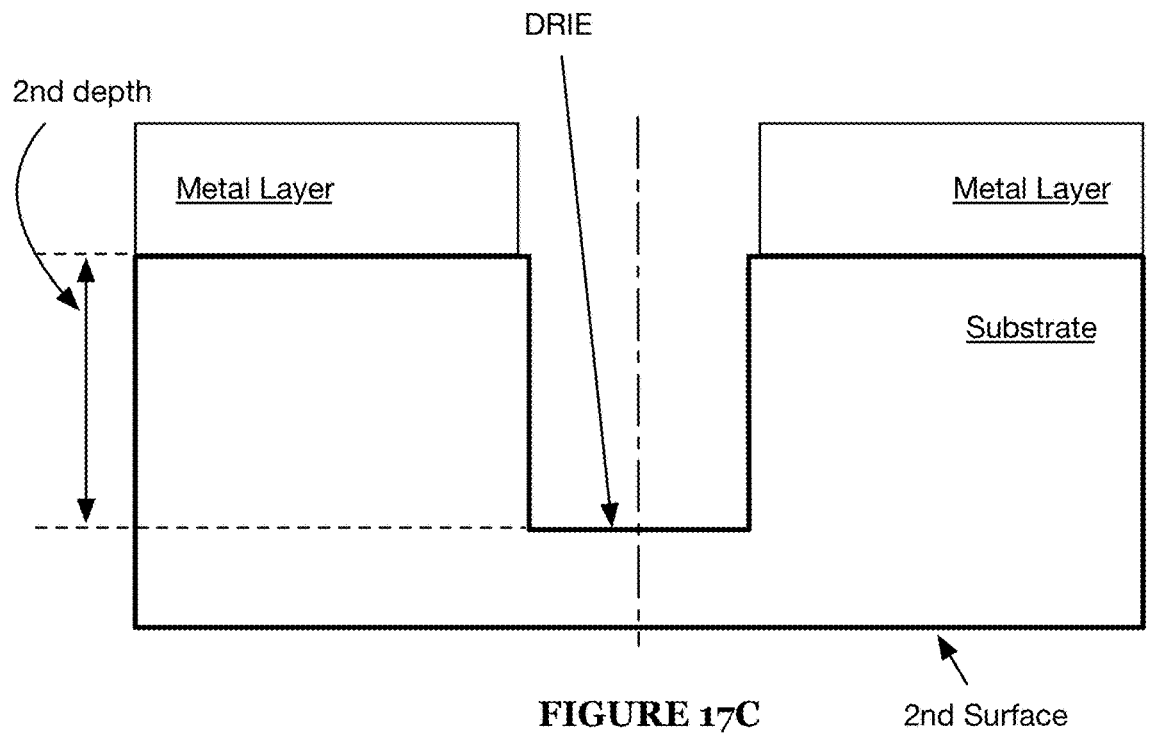
Figure 17D:
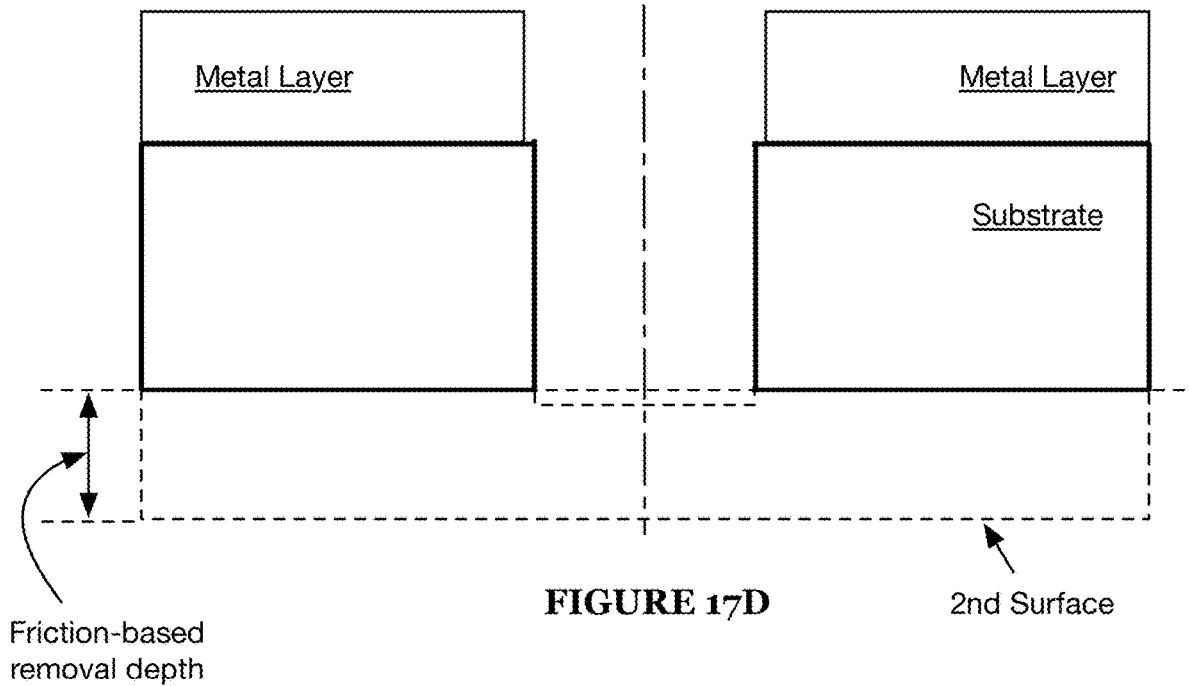
Figure 18:
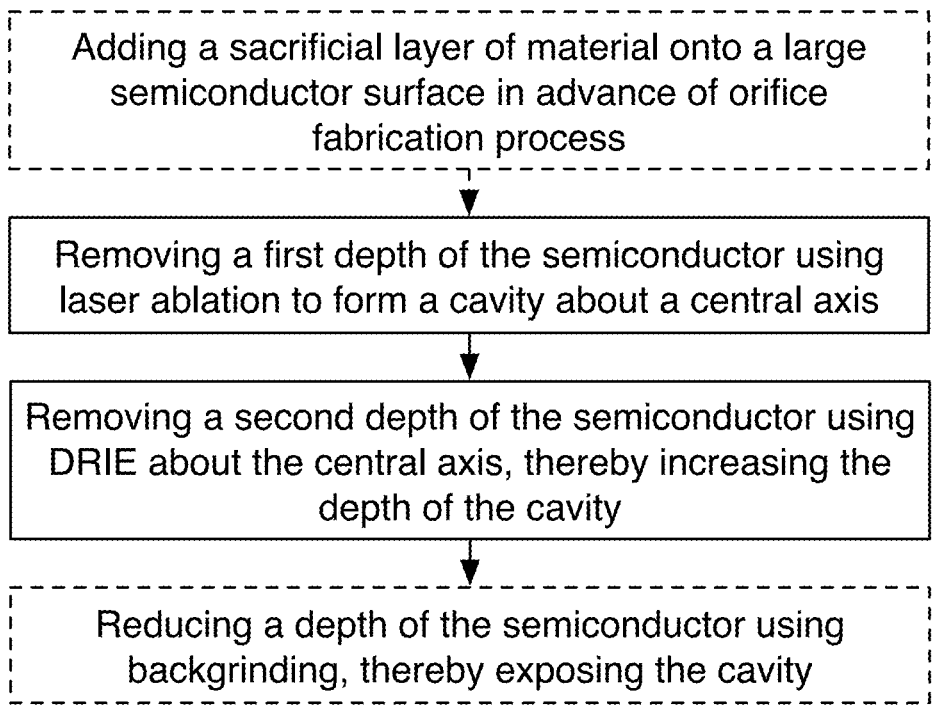
FIG. 18 is a flow diagram of an example of the method.

In a second implementation, S1220 may function to remove a first depth of material from the large semiconductor substrate that includes a section comprising substantially all of the metal layer of the semiconductor substrate and a relatively small depth of a silicon layer that includes circuitry (e.g., dielectric material, transistor material in a transistor layer, etc.), as shown by way of example in FIG. 14. In this implementation, S1220 may function to apply laser ablation to remove all metallic material along the first depth and section for an orifice that includes the metallic material residing within a silicon layer within the semiconductor substrate. In this way, S1220 may function to complete a laser ablation application for fabricating the orifice within the substrate and apply a second material removal technique at the silicon material layer.

It shall be noted that while it is preferred that a laser ablation technique is used in a first stage of material removal from the semiconductor substrate, any suitable method or technique for removing the first depth of material may be implemented including other mechanical drilling or boring techniques and/or chemical or heat application techniques suitable for removing at least the sections of the metal layer from the large semiconductor substrate.

After a removal of the first depth of material from the large semiconductor substrate, S1225, which includes removing a section of the sacrificial layer of material at and/or around the orifice, may function to additionally or alternatively apply or implement a removal process for removing the sacrificial layer or sacrificial material from a remainder of the first surface of the large semiconductor substrate. Preferably, the removal process comprises a chemical removal process that, when applied to the first surface of the large semiconductor substrate, functions to remove only the sacrificial material layer together with residual particles from a laser ablation without affecting other layers (including the active circuit layer) of the large semiconductor substrate. Accordingly, the removal process of the sacrificial layer material include removing all or substantially all (i.e., such that less than a predetermined threshold of sacrificial material remains) of the sacrificial layer material is removed from a surface of the metal layer of the large semiconductor substrate.

In one or more embodiments, S1225 may function to remove the section of the sacrificial layer based on the first depth. However, in one or more preferred embodiments, S1225 may function to remove the section of the sacrificial layer from the large semiconductor substrate based on and/or after the removal of a first depth of material and the removal of a second depth of material from the large semiconductor substrate.

Figure 13:
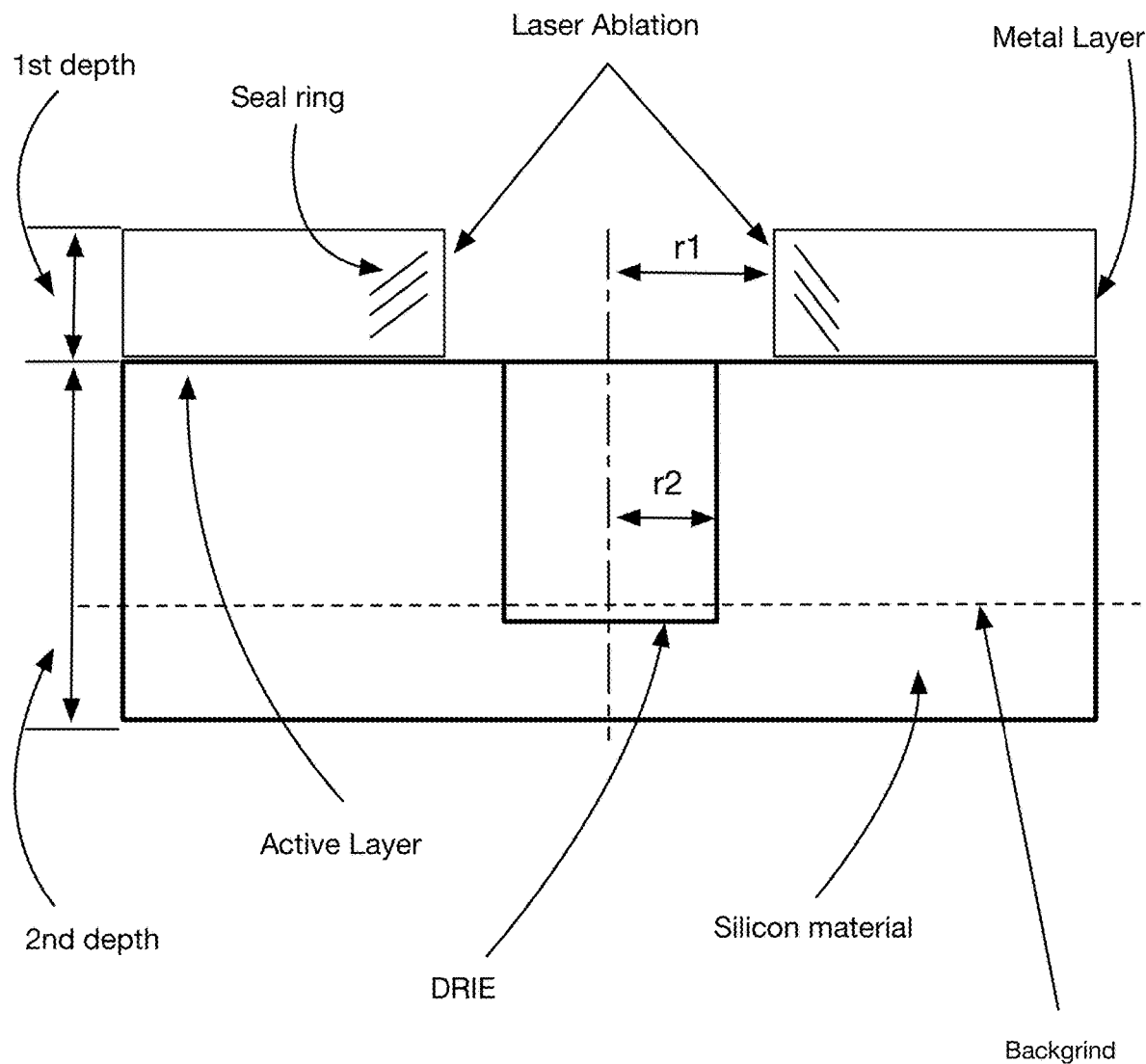
FIG. 13 illustrates a schematic of a semiconductor substrate having an orifice fabricated therein in accordance with one or more embodiments of the present application.

S1230, which includes removing a second depth of material from the large semiconductor substrate, functions to continue a fabrication of the orifice by removing a second depth of material at a point beyond the first depth of material removed from the large semiconductor substrate, as shown by way of example in FIG. 13. That is, S1230 preferably functions to apply a second removal technique that is different from the first removal technique of S1220 for removing additional layers of material for completing a fabrication of the orifice within the large semiconductor substrate. In such preferred embodiment, S1230 may function to remove the additional layer(s) of material to a second depth along a second predetermined radius that is smaller than the first predetermined radius (applied in S1220 against the first layer of material to the first depth). Additionally, or alternatively, the second depth of material preferably comprises a depth of a silicon layer of the large semiconductor substrate. In some embodiments, the second depth of material has a second depth that is greater than a first depth of the first depth of material. Additionally, or alternatively, in one or more embodiments, the first depth of material and the second depth of material define a full depth of the large semiconductor substrate such that a removal of the first depth of material and the removal of the second depth of material from the large semiconductor substrate forms a through hole orifice.

In a preferred embodiment, S1230 preferably applies a second material removal technique that comprises chemical etching to remove the second depth of material for fabricating the orifice in the substrate. In such preferred embodiment, the second material remove technique preferably include deep reactive-ion etching (DRIE) that functions to remove pointed or selected silicon material and/or the like from a depth of the large semiconductor substrate. Accordingly, once a metal layer of the large semiconductor substrate is removed, S1230 may function to apply a DRIE to selected silicon material layer(s) of the large semiconductor substrate thereby safely and cleanly removing the selected silicon material.

Additionally, or alternatively, to solve a technical problem related a slow etch rate associated with the second material removal technique, S1235 may function to pre-process the large semiconductor substrate in advance of or prior to applying the second material removal technique (of S1230) by removing trenches of material from a second surface of the large semiconductor substrate. The second surface preferably relates to a surface opposite the first surface (e.g., active circuit surface) of the large semiconductor substrate.

In one preferred embodiment, S1235 preferably includes reducing an overall thickness of the large semiconductor substrate by performing a backgrinding of the large semiconductor substrate thereby eliminating or reducing an amount of substrate material that is required to be removed during the second material removal process (involving DRIE). That is, in such preferred embodiment, S1235 may function to reduce a thickness of a silicon material of the semiconductor substrate by mechanically removing excess silicon material from an overall thickness of the silicon.

In one implementation, S1235 may function to reduce a thickness along an entire second surface of the silicon material of the large semiconductor substrate. In a second implementation, S1235 may function to selectively reduce a thickness of the silicon material at one or more positions coinciding with a position of one or more orifices within the semiconductor substrate.

Additionally, or alternatively, in one or more embodiments, S1235 may function to reduce a thickness of the semiconductor substrate and expose the cavities and/or orifices formed within the semiconductor substrate by the removal of the first depth and/or the second depth of material techniques. That is, S1270 may function to expose the cavities and/or orifices and complete a through hole fabrication within the semiconductor substrate.

It shall be noted that the method 1200 may be applied for generating a plurality of orifices along a surface of the large semiconductor substrate in any predetermined or selected arrangement, and preferably in an arrangement that enables a uniform compression of a semiconductor assembly, as described in U.S. patent application Ser. No. 16/056,792, which is incorporated herein in its entirety by this reference.

4.1 Method of Precise Wafer Singulation

As shown in FIG. 12A, a variant of the method 1200 includes a method or technique for high precision wafer singulation. The variant of the method 1200 additionally includes a setting of a singulation frame (slot) 1240, removing a first depth of material from the semiconductor substrate according to the singulation frame S1250, removing a second depth of material according to the singulation frame S1260, and optionally, reducing a depth of the semiconductor wafer S1270.

S1240, which includes setting a singulation frame, may function to arrange and/or position a singulation frame for a singulation of a large semiconductor substrate. Setting the singulation frame, in one or more embodiments, may function to define a desired shape (e.g., a singulation ring, a singulation square, etc.) and/or size of a large semiconductor substrate and further, enable a severing of an intended retained portion from an intended discarded portion of an uncut large semiconductor substrate. That is, the retained portion of the large semiconductor substrate after a severing may typically include an intended useable portion and/or desired end product of the variant of the method 1200.

Accordingly, in one or more embodiments, the singulation frame may be defined in any suitable shape or size. For instance, a singulation frame may be circular, square, rectangular, large, or the like to form a desired shape of the large semiconductor substrate or wafer. As mentioned above, setting the shape and/or size of the singulation frame may function to set the retained area or retained portion of the large semiconductor substrate.

In a preferred embodiment, a retained area, after singulation of the large semiconductor substrate, may include a plurality of distinct die formed within the large semiconductor substrate.

Additionally, or alternatively, the singulation frame may be set along any portions or segments of the large semiconductor substrate. For instance, in some embodiments, the singulation frame may be set along one or more distinct scribe lines of the large semiconductor wafer, such that a trenching or severing of the semiconductor wafer may be achieved along the scribe lines.

In a preferred embodiment, S1240 may function to set the singulation frame beyond scribe lines of a large semiconductor substrate, such that a trenching and/or severing of the semiconductor substrate may be performed segments or portions of the wafer beyond the scribe lines, which may include a severing or trenching along one or more die having active circuitry layers. That is, a singulation frame may be set to trench or sever at some of the die of the large semiconductor substrate. The severed die of the large semiconductor wafer may be referred to herein as sacrificial die. As a result, in some embodiments, the sacrificial die of the large semiconductor wafer may be repurposed to define fanouts or the like for input/output connections.

S1250, which includes removing a first depth of material, may function to remove a first depth of material along a first side of the semiconductor substrate based on the setting of the singulation frame. In one or more embodiments, S1250 may function to remove the first depth of material along one side of the singulation frame. Additionally, or alternatively, S1250 may function to remove the first depth of material along a slot within the singulation frame. In such embodiments, the slot of the singulation frame may be formed according to a desired dimensions of a trench or cutout of the first depth of material from the large semiconductor substrate.

In a preferred embodiment, S1250 may function to implement a first material removal technique that includes a laser ablation or photoablation of the first side of the large semiconductor substrate. In such preferred embodiment, S1250 may function to remove all materials along a first side of the semiconductor substrate including, but not limited to, a sacrificial material layer, a metal layer (e.g., active circuitry layer), and/or a part of a silicon layer or the like.

In a preferred embodiment, S1250 preferably removes a first depth of material from the large semiconductor substrate that does not exceed a total depth of the large semiconductor substrate. In such preferred embodiment, S1250 may function to remove a first depth of material to a (top or most upward) surface of a silicon layer of the large semiconductor substrate. Additionally, or alternatively, S1250 may function to remove a first depth of material that additionally includes a silicon layer having dielectric material, transistors, or other metal components.

S1260, which includes removing a second depth of material, may function to remove a second depth of material from the large semiconductor substrate based on a completion of the first depth of material, as described in S1250. Similar to second material removal technique of S1230, S1260 may function to implement a second material removal technique that is distinct from the first material removal technique.

In a preferred embodiment, S1260 preferably implements a second material removal technique that comprises chemical etching (e.g., DRIE, etc.) to remove the second depth of material for fabricating the orifice in the substrate. In some embodiments, the second material removal technique may be applied to remove a second depth of material that may function to sever a first part of the semiconductor substrate (i.e., a retained portion) from a second part of the semiconductor substrate (i.e., a discarded portion). That is, in such embodiments, the second material removal technique may be applied to a remained depth or a full depth of the substrate.

Alternatively, S1260 may function to apply the second removal technique to a second depth that does not fully sever the semiconductor substrate. That is, S1260 may apply the second removal technique such that a full depth removal of material from the semiconductor substrate may not be achieved.

Additionally, or alternatively, S1260 may function to remove the second depth of material along a side of the singulation frame or along a slot within the singulation frame. That is, in some embodiments, the first and/or the second removal techniques may be applied to the semiconductor substrate from within a slot of the singulation frame. For instance, in the case of the application of a laser ablation to remove a first depth of material of the like, a laser may be aligned with and/or placed within a slot of the singulation frame and performed laser ablation of the semiconductor material from its aligned and/or arranged position within the slot. Likewise, in some embodiments, a chemical etching material may be aligned and/or released from slot of a singulation frame. In such embodiments, the slot of the singulation frame may be formed according to a desired dimensions of a trench or cutout of the second depth of material from the large semiconductor substrate.

Additionally, or alternatively, the variant of the method 1200 may function to reduce an overall thickness of the large semiconductor substrate by performing a friction-based reduction or backgrinding of the large semiconductor substrate thereby eliminating or reducing an amount of substrate material that is required to be removed during the second material removal process (involving DRIE) (S1270).

Additionally, or alternatively, in one or more embodiments, S1270 may function to reduce a thickness of the semiconductor substrate and expose the trenches and/or cavities formed within the semiconductor substrate by the removal of the first depth and/or the second depth of material techniques. That is, S1270 may function to expose the trenches and/or cavities and complete a dicing and/or severing process of singulation such that a retained portion of the semiconductor substrate is completely separated from a discarded portion of the semiconductor substrate.

It shall be understood that the method 1200 and the variant(s) of the method 1200 may be performed simultaneously, such that the precise orifice fabrication (of the method 1200) and the precise singulation of a wafer (of the variant of the method 1200) may be performed in parallel and/or at the same time. For instance, in one or more embodiments, the steps of both the method 1200 and the variant of the method 1200 including the application of the sacrificial material layer, the removal of the first depth of material, the removal of the second depth of material, the optional backgrinding of the wafer and the like are performed simultaneously and preferably by the same machine(s).

It shall be understood that the method 1200 and the variants thereof are exemplary methods that may be implemented in any suitable order to achieve the inventions and/or embodiments of the inventions within the purview or that may be easily contemplated in view of the disclosure provided herein. Thus, the order and process steps should not be limited to the exemplary order provided herein.

The methods of the preferred embodiment and variations thereof can be embodied and/or implemented at least in part as a machine configured to receive a computer-readable medium storing computer-readable instructions. The instructions are preferably executed by computer-executable components preferably integrated with the lithography system and one or more portions of the processors and/or the controllers implemented thereby. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

Although omitted for conciseness, the preferred embodiments include every combination and permutation of the various methods, apparatus, and systems described herein.

As a person skilled in the art will recognize from the previous detailed description and from the figures and claims, modifications and changes can be made to the preferred embodiments of the invention without departing from the scope of this invention defined in the following claims.

What is claimed is:

1. A method comprising:
   adding a sacrificial layer to a first surface of a semiconductor substrate; and
   along an orifice axis normal to the first surface, subsequently:
      fabricating a cavity in the semiconductor substrate using a first material removal technique, the cavity comprising a first radius about the orifice axis and a first depth along the orifice axis; and
      subsequently fabricating an orifice in the semiconductor substrate using a second material removal technique, the orifice comprising a second radius about the orifice axis, the orifice extending from the first depth, along the orifice axis, wherein the second radial distance defines a diameter of about 2 millimeters, wherein the second radius has a second radial distance that is smaller than a first radial distance of first radius,
   wherein the first and second material removal techniques remove material in the same direction along the orifice axis.

2. The method according to claim 1, wherein
fabricating the cavity comprises removing at least a radial section of the sacrificial layer and a radial section of a metal layer formed at the first surface of the semiconductor substrate.

3. The method according to claim 2, wherein
fabricating the cavity further comprises removing a radial section of dielectric material from the semiconductor substrate.

4. The method according to claim 1, wherein:
the second material removal technique is different from the first material removal technique.

5. The method according to claim 4, wherein
the first material removal technique comprises laser ablation.

6. The method according to claim 5, wherein
the second material removal technique comprises chemical etching.

7. The method according to claim 1, wherein:
the first depth comprises a full depth of a metal layer of the semiconductor substrate and a partial depth of a silicon layer of the semiconductor substrate.

8. The method according to claim 1, wherein
fabricating the cavity in the semiconductor substrate using a first material removal technique comprises:
   removing the first depth of material of the semiconductor substrate that includes an active circuitry layer of material until a silicon layer of material of the semiconductor substrate that is arranged beyond the first depth of material is exposed.

9. The method according to claim 1, further comprising:
removing the sacrificial layer of material along an entirety of the first surface of the semiconductor substrate after fabricating the cavity.

10. The method according to claim 1, wherein:
fabricating the orifice further comprises reducing a depth of the semiconductor substrate along a second surface of the semiconductor substrate that is opposite the first surface of the semiconductor substrate thereby exposing a through-hole cooperatively fabricated by the first and second material removal techniques.

11. The method according to claim 1, further comprising
in advance of fabricating the orifice, removing a plurality of trenches of material along a second surface of the semiconductor substrate that is opposite the first surface of the semiconductor substrate.

12. The method according to claim 1, wherein
before fabricating the cavity, the semiconductor substrate comprises a first composition of material along the orifice axis up to the first depth that is different from a second composition of material of the semiconductor substrate along the orifice axis at the second depth.

13. The method according to claim 1, wherein:
adding the sacrificial layer to the first surface of the semiconductor substrate includes:
  depositing a coating of sacrificial material onto a first surface that includes an active circuitry layer of the semiconductor substrate.

14. The method according to claim 1, wherein:
the second depth is greater than the first depth.

* * * * *